(12) United States Patent
Kim et al.

(10) Patent No.: US 11,521,678 B2
(45) Date of Patent: Dec. 6, 2022

(54) SYNAPSE AND SYNAPTIC ARRAY, AND COMPUTING SYSTEM USING THE SAME AND DRIVING METHOD THEREOF

(71) Applicant: KOOKMIN UNIVERSITY INDUSTRY ACADEMY COOPERATION FOUNDATION, Seoul (KR)

(72) Inventors: Donguk Kim, Suwon-si (KR); Jun Tae Jang, Bucheon-si (KR); Dae Hwan Kim, Seoul (KR); Dong Myoung Kim, Seoul (KR); Sung Jin Choi, Seoul (KR)

(73) Assignee: KOOKMIN UNIVERSITY INDUSTRY ACADEMY COOPERATION FOUNDATION, Seoul (KR)

( * ) Notice: Subject to any disclaimer, the term of this patent is extended or adjusted under 35 U.S.C. 154(b) by 0 days.

(21) Appl. No.: 17/405,174

(22) Filed: Aug. 18, 2021

(65) Prior Publication Data
US 2022/0068379 A1 Mar. 3, 2022

(30) Foreign Application Priority Data
Aug. 26, 2020 (KR) .................. 10-2020-0107592

(51) Int. Cl.
*G11C 13/00* (2006.01)
*H01L 27/24* (2006.01)

(52) U.S. Cl.
CPC ........ *G11C 13/0011* (2013.01); *G11C 13/004* (2013.01); *G11C 13/0069* (2013.01);
(Continued)

(58) Field of Classification Search
CPC ............. G11C 13/0011; G11C 13/004; G11C 13/0069; G11C 13/0097; G11C 2013/009;
(Continued)

(56) References Cited

U.S. PATENT DOCUMENTS 10,726,896 B1\* 7/2020 Jacob .................. G11C 11/1673
2008/0158137 A1\* 7/2008 Yoshida ............... G09G 3/3622
250/214 A
(Continued)

FOREIGN PATENT DOCUMENTS

JP 2000020634 1/2000
KR 20170025715 3/2017
(Continued)

OTHER PUBLICATIONS

Jang et al. "One Transistor-Two Memristor Based on Amorphous Indium-Gallium-Zinc-Oxide for Neuromorphic Synaptic Devices" *ACS Appl. Electron. Mater.* 2020, 58 pages.
(Continued)

*Primary Examiner* — Michael T Tran
(74) *Attorney, Agent, or Firm* — Norton Rose Fulbright US LLP

(57) ABSTRACT

The present invention relates to a synapse and synaptic array, and a computing system using the same. The synaptic device according to an exemplary embodiment of the present invention includes a transistor in which a synaptic input signal is applied to any one electrode of source and drain electrodes; and a plurality of two-terminal variable resistance memory devices in which a first electrode is electrically globally connected to a gate electrode of the transistor, wherein a separate memory voltage is applied to a second electrode of each variable resistance memory device to adjust a gate voltage applied to the gate electrode, thereby
(Continued)

controlling a synaptic output signal which is output to the other one of the source and drain electrodes.

19 Claims, 23 Drawing Sheets

(52) U.S. Cl.
CPC ...... *G11C 13/0097* (2013.01); *H01L 27/2463* (2013.01); *G11C 2013/009* (2013.01)

(58) Field of Classification Search
CPC ............ G11C 2213/15; G11C 2213/54; G11C 11/1659; G11C 11/2259; G11C 13/0004; G11C 13/0007; G11C 13/003; G11C 2213/53; G11C 11/54; G11C 13/0038; G11C 13/0061; H01L 27/2463; H01L 45/1206; H01L 45/145; G06N 3/0635; G06N 3/063
USPC .................................................. 365/158, 167
See application file for complete search history.

(56) References Cited

U.S. PATENT DOCUMENTS

| | | | | |
|---|---|---|---|---|
| 2010/0299297 | A1* | 11/2010 | Breitwisch | G06N 3/049 706/33 |
| 2012/0313801 | A1* | 12/2012 | Maejima | H03M 1/366 341/155 |
| 2012/0317063 | A1* | 12/2012 | Sim | G11C 13/003 706/27 |
| 2016/0372174 | A1* | 12/2016 | Ohsawa | G11C 11/1659 |
| 2018/0082168 | A1* | 3/2018 | Marukame | H01L 27/2463 |
| 2018/0225566 | A1* | 8/2018 | Lee | G06N 3/049 |
| 2018/0314929 | A1* | 11/2018 | Lee | G06N 3/0635 |
| 2019/0164046 | A1* | 5/2019 | Song | G06N 3/0635 |
| 2020/0110990 | A1* | 4/2020 | Harada | H01L 27/108 |
| 2020/0126619 | A1* | 4/2020 | Jaiswal | G11C 5/147 |
| 2020/0167638 | A1* | 5/2020 | Rummens | G11C 13/0019 |
| 2020/0202202 | A1* | 6/2020 | Chava | G06N 3/04 |
| 2020/0202206 | A1* | 6/2020 | Rummens | G11C 13/004 |
| 2021/0011687 | A1* | 1/2021 | Shuto | G06N 3/063 |
| 2021/0065793 | A1* | 3/2021 | Ge | G11C 13/0023 |
| 2021/0082494 | A1* | 3/2021 | Liaw | G11C 11/412 |
| 2022/0198247 | A1* | 6/2022 | Ma | G06N 3/063 |

FOREIGN PATENT DOCUMENTS

| | | |
|---|---|---|
| KR | 20180111156 | 10/2018 |
| KR | 20190116820 | 10/2019 |
| KR | 20200023745 | 3/2020 |

OTHER PUBLICATIONS

Lee et al., "Highly stable, solution-processed quaternary oxide thin film-based resistive switching random access memory devices via global and local stoichiometric manipulation strategy" *Nanotechnology* 2020, 31: 245202, 11 pages.

Office Action issued in Corresponding Korean Application No. 10-2020-0107592, dated Jul. 20, 2022 (English Translation provided).

* cited by examiner

SYNAPSE AND SYNAPTIC ARRAY, AND COMPUTING SYSTEM USING THE SAME AND DRIVING METHOD THEREOF

CROSS-REFERENCE TO RELATED APPLICATION

This application claims priority to and the benefit of Korean Patent Application No. 10-2020-0107592, filed on Aug. 26, 2020, the disclosure of which is incorporated herein by reference in its entirety.

BACKGROUND

Field of the Disclosure

The present invention relates to a neuromorphic device, a system thereof and a driving method thereof, and more specifically to a neuromorphic device capable of improving a trade-off characteristic between the symmetry and linearity of conductance modulation of a resistance variable memory device, a system thereof and a driving method thereof.

Description of Related Art

The computing system developed so far consists of the von-Neumann architecture in which a memory, a processor, a controller and the like exist separately, and it has been developed through arithmetic and logic devices using semiconductor materials and the integration of memory devices. For example, most of the digital and analog circuits of the memory and processing unit may be configured to include a complementary metal-oxide-semiconductor (CMOS) device. According to the performance improvement of computing and information technology, it is possible to effectively reduce power consumption while increasing the operating frequency based on the permanent scaling down of such CMOS devices.

However, compared to the system improvement demands which require continuous improvement of the integration density, it has almost reached a limit in increasing the degree of integration of the device. That is, the degree of integration of the latest CMOS devices and the like does not follow Moore's Law, and the scaling down thereof is also rapidly reaching its physical limit.

In addition, in a more complex information processing environment and an environment requiring high-density information storage, the conventional von Neumann system has a limitation in performance improvement due to delay in signal transmission between a logic device and a memory device and also has a problem of high energy consumption. That is, the performance of the von Neumann system may be severely degraded due to the time and energy required to transfer data between the memory and the processor while the power consumption and operating temperature increase due to an increase in operating frequency and device density. This phenomenon is particularly noticeable in the data-driven application fields such as real-time image recognition, natural language processing and the like, and the von Neumann system cannot outperform the human brain in these applications.

Unlike the von Neumann system, the human brain has a characteristic of simultaneously performing computational and memory functions through synapses as well as parallel processing capabilities using high connectivity. That is, there are about $10^{11}$ neurons in the human brain, which act as low-power computing elements, and about $10^4$ connections called synapses exist between the neurons, respectively, which act as adaptive memory devices, and thus, a massive amount of information can be processed in parallel through the connected large-scale parallel structure. As a result, the von Neumann system exhibits better performance than the human brain in simple calculations, but the human brain performs better in complex environments such as unstructured data classification, pattern recognition and the like.

Accordingly, in a complex information processing environment, neuromorphic systems simulating the human brain may show better performance than the von Neumann system. For example, these neuromorphic systems can mimic the large-scale parallelism and extremely low-power operation found in the human brain through an ultra-dense crossbar array consisting of memristor devices.

In order to implement such neuromorphic systems, various synaptic devices using variable resistance memory devices such as memristors and the like have been developed. That is, various types of synaptic devices based on phase shift, resistance change, ferromagnetic, ferroelectric and field effect transistors have been proposed to mimic the function of biological synapses. Among these, the resistance change-based memristor has received great attention due to its simple two-terminal structure, low energy consumption per neuron activity, the possibility of implementing the analog synaptic weight modulation and the like. That is, the memristor is a variable resistance memory device that maintains an internal conductance state according to the history of the amount of flowing charge, and the conductance thereof can be modulated. This conductance state may be used to emulate a synaptic weight through a synaptic input signal of voltage and a synaptic output signal of current.

However, the conventional synaptic device has a problem in that a trade-off characteristic between symmetry and linearity occurs during conductance modulation due to resistance variable memory devices such as a memristor. That is, as the conductance modulation achieved symmetry, the nonlinearity became more pronounced, and as the linearity was achieved, the asymmetry became more pronounced.

In addition to such problems of the asymmetry and nonlinearity of conductance modulation, there has been a problem in which a sneak path occurs, as the conventional synaptic device is implemented in a crossbar array structure and processes the input and output signals of a synapse through the memristor.

SUMMARY

In order to solve the problems of the prior art as described above, it is an object of the present invention to provide a neuromorphic device capable of improving a trade-off characteristic between the symmetry and linearity of conductance modulation of a resistance variable memory device, a system thereof and a driving method thereof.

In addition, it is an object of the present invention to provide a neuromorphic device capable of restricting a sneak path even when a synapse is implemented in a crossbar array structure, a system thereof and a driving method thereof.

However, the problems to be solved by the present invention are not limited to the above-mentioned problems, and other problems that are not mentioned can be clearly understood by those of ordinary skill in the art to which the present invention pertains from the description below.

A synapse according to an exemplary embodiment of the present invention for solving the above problems includes a transistor in which a synaptic input signal is applied to any one electrode of source and drain electrodes; and a plurality of two-terminal variable resistance memory devices in which a first electrode is electrically globally connected to a gate electrode of the transistor, wherein a separate memory voltage is applied to a second electrode of each variable resistance memory device to adjust a gate voltage applied to the gate electrode, thereby controlling a synaptic output signal which is output to the other one of the source and drain electrodes.

In the synapse according to an exemplary embodiment of the present invention, the total conductance of all variable resistance memory devices is modulated to adjust the gate voltage, by modulating the conductance of each variable resistance memory device according to each memory voltage.

A memory voltage of a bias may be applied to a first variable resistance memory device, and a memory voltage of a potentiation pulse or depression pulse may be applied to a second variable resistance memory device.

While the conductance of a first variable resistance memory device increases, the conductance of a second variable resistance memory device may decrease, and the modulation of the total conductance of all variable resistance memory devices may be limited thereby.

In the synapse according to an exemplary embodiment of the present invention, while a first variable resistance memory device performs a SET operation, a second variable resistance memory device may perform a RESET operation.

The variable resistance memory device performing a SET operation may be in a low resistance state, and the variable resistance memory device performing a RESET operation may be in a high resistance state.

In the synapse according to an exemplary embodiment of the present invention, when a memory voltage of a bias is applied to a first variable resistance memory device and pulses having a potentiation pulse and a depression pulse are repeatedly applied to a second variable resistance memory device, the total conductance may gradually increase and then gradually decrease.

The variable resistance memory device may include any one of a memristor, a resistive random access memory (RRAM), a phase-change random access memory (PcRAM), a magnetic random access memory (MRAM), a ferroelectric random access memory (FeRAM) and a conductive bridging random access memory (CBRAM).

The variable resistance memory device made of a memristor may include a first electrode electrically connected to the gate electrode; a resistance change layer provided on the first electrode in which a change in resistance occurs according to an applied voltage between the two electrodes; and a second electrode provided on the resistance change layer to which a memory voltage is applied.

The resistance change layer may be made of an oxide material, and the resistance may be changed in the memristor according to the movement of oxygen charge in accordance with a memory voltage such that the switching characteristic of a SET operation or RESET operation may be changed.

While oxygen charge moves from the periphery of the first electrode to the periphery of the second electrode in a first memristor to perform a SET operation, oxygen charge may move from the periphery of the second electrode to the periphery of the first electrode in a second memristor to perform a RESET operation.

The channel layer of the transistor and the resistance change layer of the memristor may be made of the same oxide material.

The resistance change layer may include one or more materials selected from IGZO, ITZO, IWZO, ZSO, IZO and IGO.

The first electrode may be made of p-type conductive Si, the first material layer may be made of $SiO_2$, and the resistance change layer may include one or more materials selected from IGZO, ITZO, IWZO, ZSO, IZO and IGO.

The first electrode of each variable resistance memory device and the gate electrode of the transistor may have a global electrode structure sharing an electrode with each other.

A synaptic array according to an exemplary embodiment of the present invention includes a plurality of input lines to which a synaptic input signal is input, a plurality of output lines from which a synaptic output signal is output, a plurality of memory lines to which a memory voltage is applied, and a plurality of synapses electrically connected to each line, respectively. In this case, the synapse may include a transistor in which any one of source and drain electrodes is electrically connected to the input line, and the other one is electrically connected to the output line; and a plurality of two-terminal variable resistance memory devices in which each first electrode is electrically globally connected to a gate electrode of the transistor, and each second electrode is electrically connected to a separate memory line to adjust a gate voltage applied to the gate electrode, thereby controlling a synaptic output signal which is output to the other one of the source and drain electrodes.

A computing system according to an exemplary embodiment of the present invention includes the above-described synapse.

The synapse may be implemented in a crossbar array.

In a method for operating a synapse according to an exemplary embodiment of the present invention, the synapse includes a transistor in which a synaptic input signal is applied to any one electrode of source and drain electrodes, and a plurality of two-terminal variable resistance memory devices in which a first electrode is electrically globally connected to a gate electrode of the transistor. In addition, the method includes applying a separate memory voltage to a second electrode of each variable resistance memory device, applying a memory voltage of a bias to a first variable resistance memory device, and applying a memory voltage of a potentiation pulse or a depression pulse to a second variable resistance memory device; and adjusting a gate voltage applied to the gate electrode according to the memory voltage, thereby controlling a synaptic output signal which is output to the other one of the source and drain electrodes.

The present invention configured as described above can improve a trade-off characteristic between the symmetry and linearity of conductance modulation in a synaptic device, and thus has an advantage in that both the symmetry and linearity can be satisfied.

In addition, the present invention has an advantage of improving the gradualness of conductance modulation in a synaptic device.

In addition, the present invention has an advantage of restricting a sneak path even when a synapse is implemented in a crossbar array structure.

In addition, the present invention has an advantage that excellent pattern recognition accuracy is possible when applied to an artificial neural network and the like.

The effects that can be obtained in the present invention are not limited to the above-mentioned effects, and other effects that are not mentioned can be clearly understood by those of ordinary skill in the art to which the present invention pertains from the following description.

DETAILED DESCRIPTION OF THE INVENTION

Figure 1:
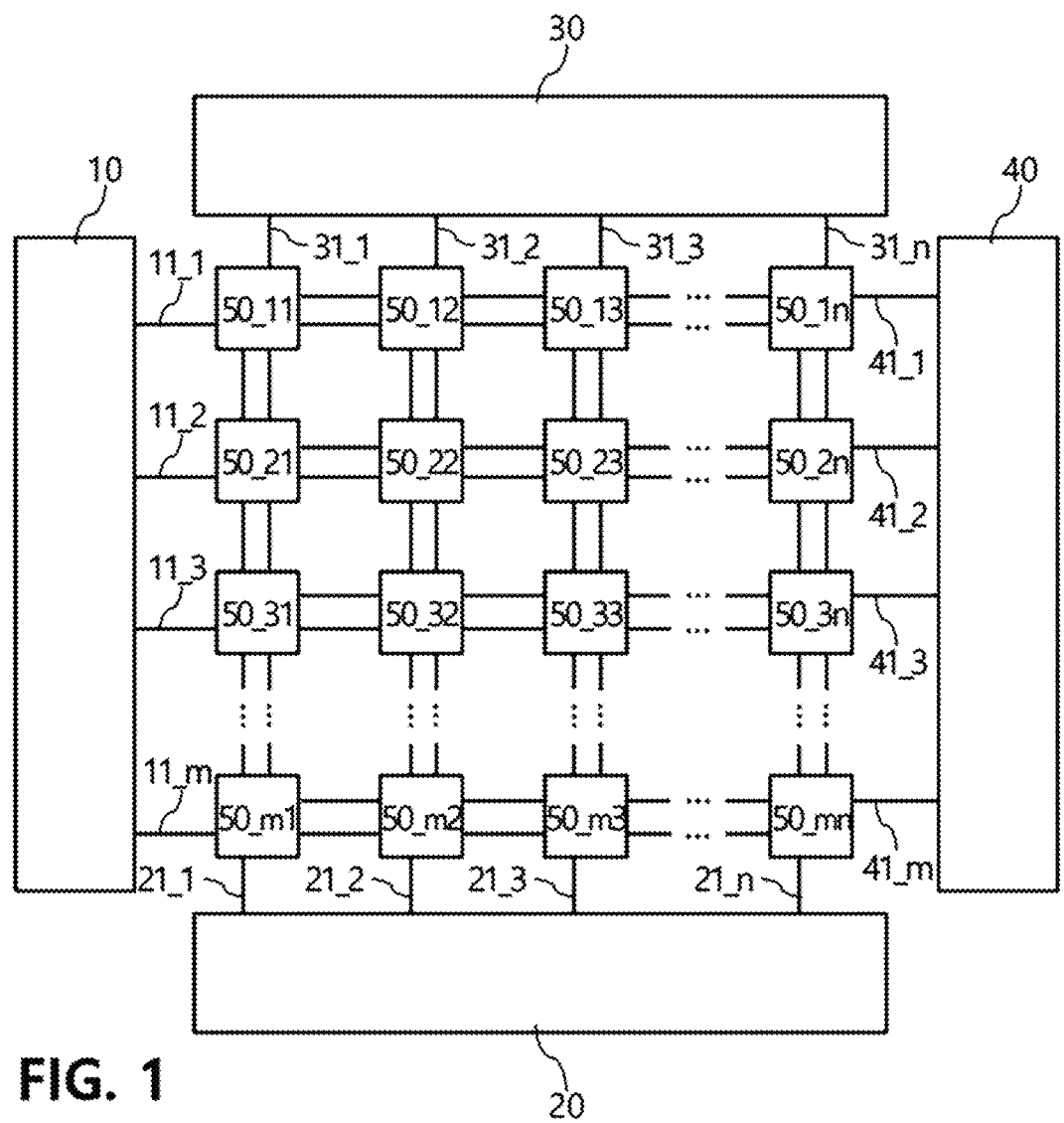
FIG. 1 is a block diagram conceptually illustrating the synaptic array of a neuromorphic device according to an exemplary embodiment of the present invention.

The above objects and means of the present invention and effects thereof will become more apparent from the following detailed description taken in conjunction with the accompanying drawings, and accordingly, those having ordinary skill in the art to which the present invention pertains may easily practice the technical spirit of the present invention. In addition, in describing the present invention, when it is determined that the detailed description of the known technology related to the present invention may unnecessarily obscure the gist of the present invention, the detailed description thereof will be omitted.

The terminology as used herein is for the purpose of describing exemplary embodiments only and is not intended to be limiting the present invention. In the present specification, the singular forms also include the plural forms unless the case otherwise indicates. In the present specification, terms such as "comprise", "include", "prepare" or "have" do not exclude the presence or addition of one or more other components than the components mentioned.

In the present specification, terms such as "or", "at least one" and the like may refer to one of the words listed together, or may represent a combination of two or more. For example, "or B" and "at least one of B" may include only one of A or B, and may include both A and B.

In the present specification, descriptions that follow "for example" and the like may not exactly match the information presented, such as the recited characteristics, variables, or values, and the exemplary embodiments of the present invention according to various examples of the present invention should not be limited to effects such as variations including tolerance errors, measurement errors, limits of measurement accuracy and other commonly known factors.

In the present specification, when a component is described as being 'connected' or 'joined' to another component, it should be understood that it may be directly connected to or joined to the other component, but another component may be present therebetween. On the other hand, when a component is mentioned to be 'directly connected' or 'directly joined' to another component, it should be understood that there is no other component therebetween.

In the present specification, when a component is described as being 'on' or 'facing' another component, it should be understood that the component may be directly in contact with or connected to another component, but another component may be present therebetween. On the other hand, when a component is described as being 'directly on' or 'directly in contact' with another component, it may be understood that there is no other component therebetween. Other expressions describing the relationship between the components, such as 'between' and 'directly between', may be interpreted in the same manner.

In the present specification, terms such as 'first', 'second' and the like may be used to describe various components, but the components should not be limited by the above terms. In addition, the above terms should not be construed as limiting the order of each component, but may be used for the purpose of distinguishing one component from another. For example, a 'first component' may be referred to as a 'second component', and similarly, a 'second component' may also be referred to as a 'first component'.

Unless otherwise defined, all terms used in the present specification may be used with meanings that can be commonly understood by those of ordinary skill in the art to which the present invention pertains. In addition, terms that are defined in a commonly used dictionary are not ideally or excessively interpreted unless they are specifically defined clearly.

In the present specification, "potentiation" and "SET" will be used as the same or similar terms, and "depressing" and "RESET" will be used with the same or similar meanings. For example, an operation of lowering the resistance of a synapse or a variable resistance device (i.e., an operation of increasing conductance) will be described as "potentiation" and "SET". In addition, an operation of increasing the resistance of a synapse or a variable resistance device (i.e., an operation of decreasing conductance) will be described as "depressing" or "RESET". Collectively, all of these operations will be referred to as "programming."

"Programming" may encompass all operations for changing the resistance (conductance) of a synapse or a variable resistance device. When a synapse or a variable resistance device is "potentiated" or "SET", the conductance increases such that a progressively higher voltage/current may be output, and when the synapse or variable resistive device is "depressed" or "RESET", the conductance decreases such that a gradually lower voltage/current may be output. In addition, voltage and current may be interpreted as the same or interchangeable meanings. In addition, resistance variation (modulation, switching) and conductance variation (modulation, switching) may also be interpreted as the same or interchangeable meanings, but the size thereof may be changed in inverse proportion to each other.

Hereinafter, a preferred exemplary embodiment according to the present invention will be described in detail with reference to the accompanying drawings.

FIG. 1 is a block diagram conceptually illustrating the synaptic array of a neuromorphic device according to an exemplary embodiment of the present invention.

A neuromorphic device (or system) according to an exemplary embodiment of the present invention is a device (or system) that processes information by simulating the human brain, and may include a plurality of pre-synaptic neurons and post-synaptic neurons, and a synaptic array connecting between these neurons. In this case, as illustrated in FIG. 1, the synaptic array has a structure in which each synaptic device 50 is electrically connected to an input circuit 10, an output circuit 20, a first driver 30 and a second driver 40.

Figure 2:
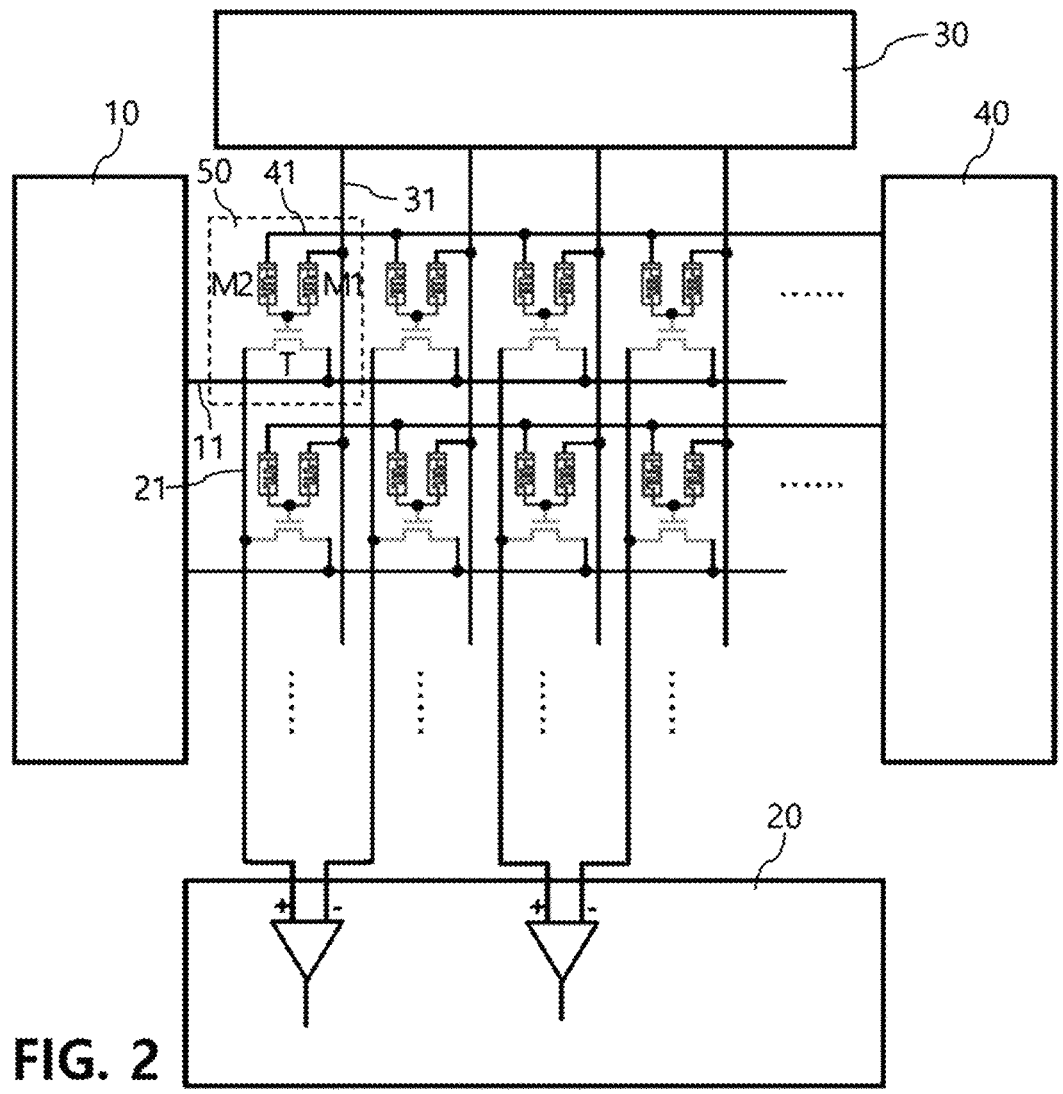
FIG. 2 is a block diagram illustrating the synaptic array of a neuromorphic device including a plurality of synaptic devices 50 made of two variable resistance memory devices M1 and M2 and one transistor T.

In particular, the synaptic array includes a plurality of arranged synapses. In this case, one synapse may include at least one synaptic device 50. The synaptic array may include a plurality of synaptic devices 50 (i.e., 50_11 to 50_mn) (provided that m and n are natural numbers, one of which is a natural number greater than or equal to two). However, one synapse may be made of a plurality of synaptic devices 50. For example, as illustrated in FIG. 2, each synaptic output signal of two synaptic devices 50 may be transmitted as each input signal from the integrator of one post-synaptic neuron included in the output circuit 20, that is, a positive (+) input signal and a negative (−) input signal, but the present invention is not limited thereto.

The input circuit 10 transmits a synaptic input signal, which is an electrical signal, to each synaptic device 50 through a plurality of input lines 11 (i.e., 11_1 to 11_m). For example, such an input circuit 10 may include a plurality of pre-synaptic neurons and a circuit electrically connecting the same, but is not limited thereto.

The output circuit 20 receives a synaptic output signal that is an electrical signal which is output from each synaptic device 50 through a plurality of output lines 21 (i.e., 21_1 to 21_n), and performs the processing of various signals according to the synaptic output signal. For example, such an output circuit 20 may include a plurality of post-synaptic neurons and a circuit electrically connecting the same, and each post-synaptic neuron may include an integrator, a comparator and the like, but is limited thereto.

The first driver 30 transmits a first memory signal, which is an electrical signal, to each synaptic device 50 through a plurality of first memory lines 31 (i.e., 31_1 to 31_n). Similarly, the second driver 40 transmits a second memory signal, which is an electrical signal, to each synaptic device 50 through a plurality of second memory lines 41 (i.e., 41_1 to 41_m).

Figure 3:
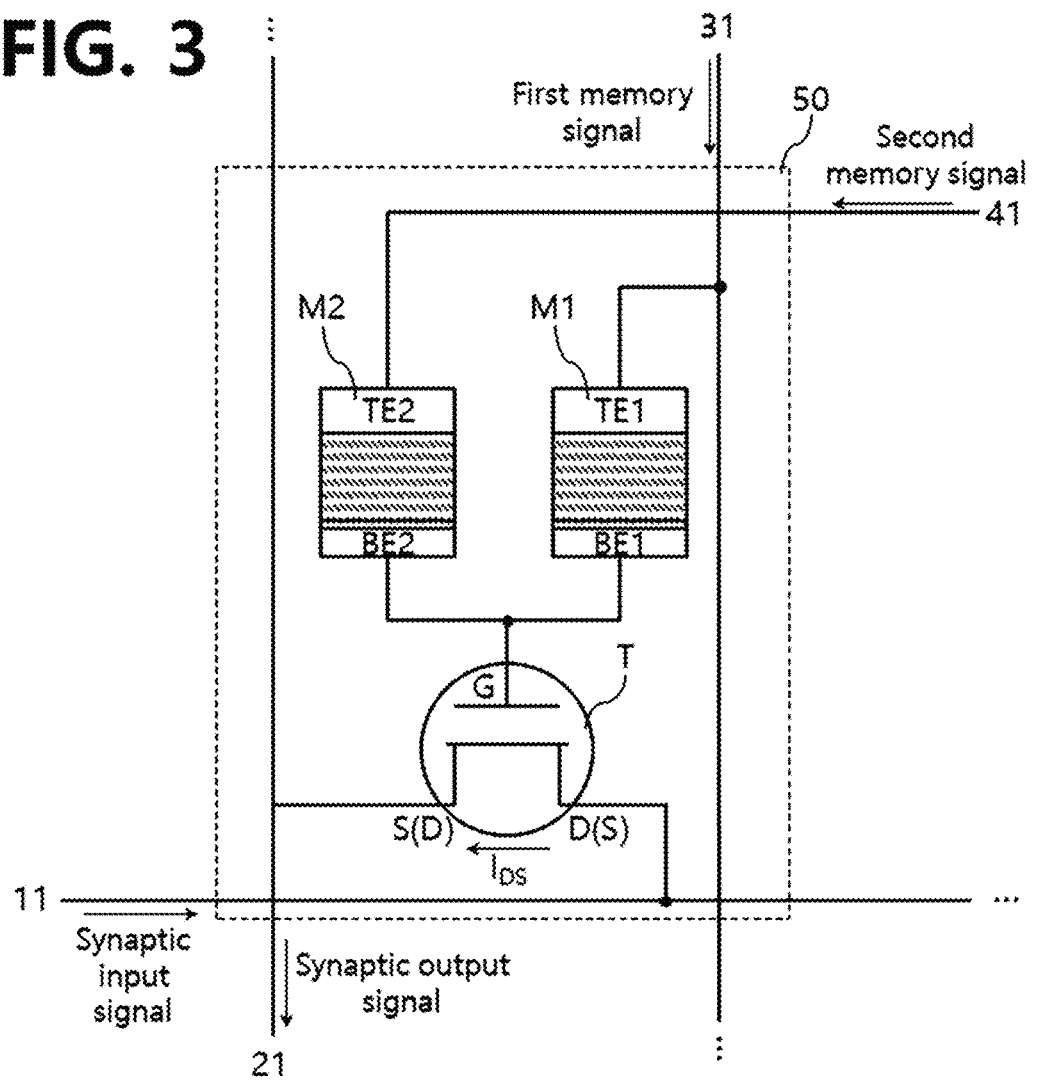
FIG. 3 shows an enlarged view illustrating in more detail one synaptic device 50 in FIG. 2.

FIG. 2 is a block diagram illustrating the synaptic array of a neuromorphic device including a plurality of synaptic devices 50 made of two variable resistance memory devices M1 and M2 and one transistor T, and FIG. 3 shows an enlarged view illustrating in more detail one synaptic device 50 in FIG. 2.

Meanwhile, referring to FIGS. 2 and 3, each synaptic device 50 includes two variable resistance memory devices M1 and M2 and one transistor T. Hereinafter, the synaptic device 50 having this structure is also referred to as "2M1T." However, the two variable resistance memory devices M1 and M2 may be formed as a single structure, which will be described below with reference to FIGS. 5A-5B.

The variable resistance memory devices M1 and M2 are devices capable of resistance variation (i.e., conductance variation) in a memory signal in an applied SET mode or RESET mode. For example, the variable resistance memory devices M1 and M2 may include any one or more of a memristor, a resistive random access memory (RRAM), a phase-change random access memory (PcRAM), a magnetic random access memory (MRAM), and a ferroelectric random access memory (FeRAM) and a conductive bridging random access memory (CBRAM), but is not limited thereto. Such variable resistance memory devices M1 and M2 have a characteristic of maintaining resistance according to the history of a previously inputted memory signal in the SET or RESET mode. The information on the maintained resistance may be derived when a memory signal in the reading mode is applied.

Figure 4:
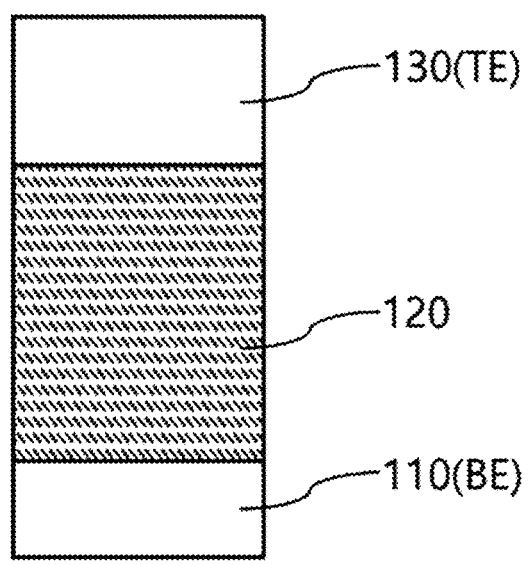
FIG. 4 shows various examples of the configuration of a memristor device 100 applicable to the synapse of a neuromorphic device according to an exemplary embodiment of the present invention.
Figure 5A:
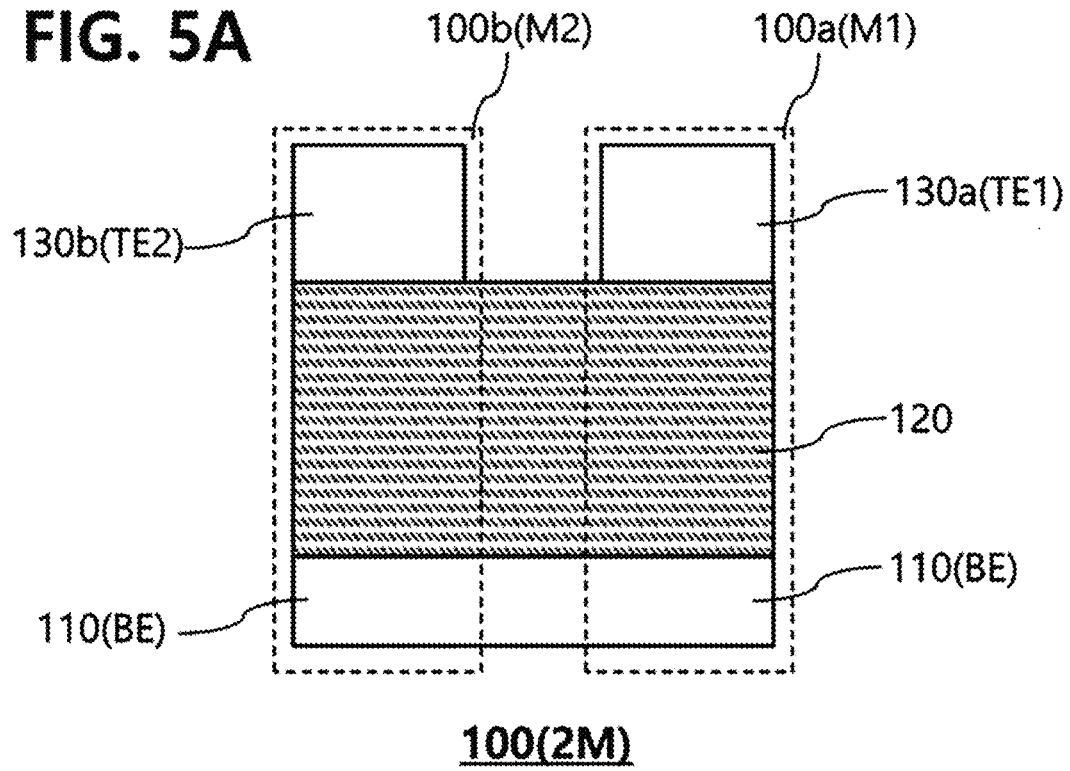
FIGS. 5A-5B show an example of the configuration of two memristor devices 100a and 100b applicable to the synapse of a neuromorphic device according to an exemplary embodiment of the present invention.
Figure 5B:
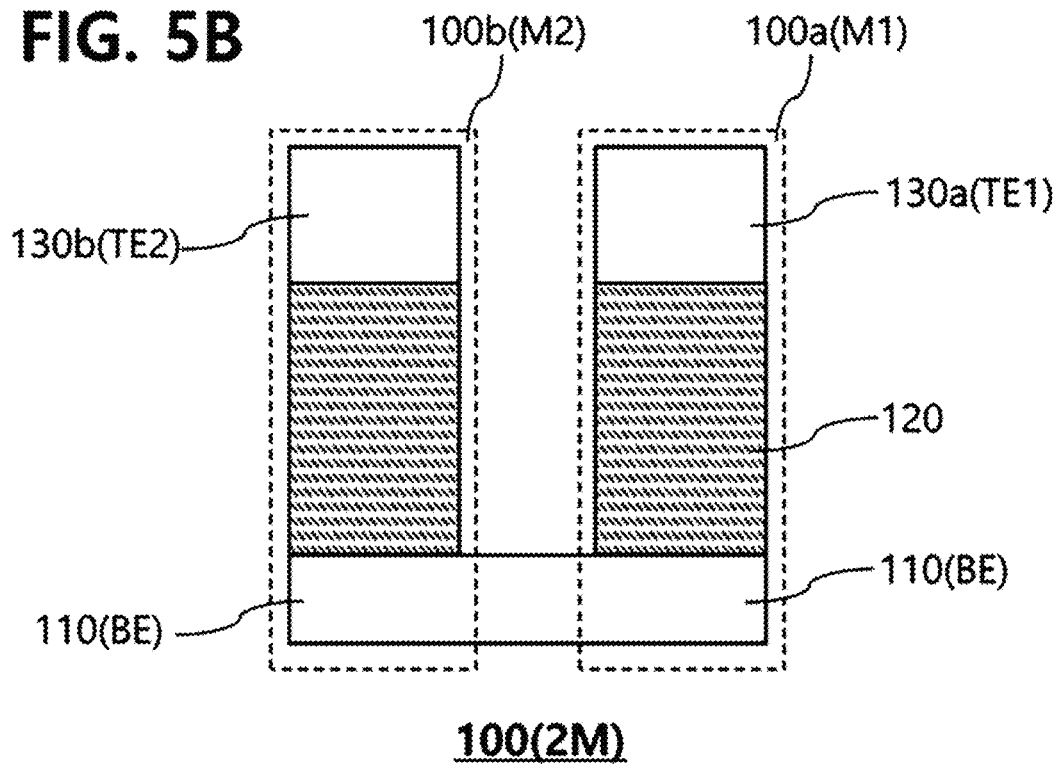

FIG. 4 shows various examples of the configuration of a memristor device 100 applicable to the synapse of a neuromorphic device according to an exemplary embodiment of the present invention, and FIGS. 5A-5B shows an example of the configuration of two memristor devices 100a and 100b applicable to the synapse of a neuromorphic device according to an exemplary embodiment of the present invention.

In particular, the variable resistance memory devices M1 and M2 may be made of a memristor device 100 as illustrated in FIGS. 4 and 5. Hereinafter, a case in which the variable resistance memory devices M1 and M2 are made of a two-terminal memristor device 100 will be described, but the present invention is not limited thereto. In addition, the connection to the two-terminal memristor device 100, each signal (memory signal and synaptic input signal) applied to the synaptic device 50, the characteristics of the memristor device 100 according to the applied signal, synaptic output signals which are output from the synaptic device 50 and the like may be applied to other two-terminal variable resistance memory devices.

The memristor device 100 according to an exemplary embodiment of the present invention is a device capable of various resistive switching (RS). In this case, the memristor device 100 may include a first electrode 110, an insulating layer, a resistance change layer 120 and a second electrode 130, and may have a structure in which these are sequentially stacked. Such a memristor device 100 is a two-terminal device formed by the first electrode 110 and the second electrode 130.

First, the first electrode 110 includes a conductive material, and a global voltage such as ground may be applied thereto. In this case, the first electrode 110 may act as a global bottom electrode (BE). However, the first electrode 110 may be made of a high concentration of P-type Si ($p^+$ Si). In this case, since the first electrode 110 may act as a conductive substrate that is both a base and an electrode, it may have advantages such as a simple process, low manufacturing cost and the like, compared to a conventional memristor device in which a separate base substrate and an electrode should be separately implemented.

The second electrode 130 includes a conductive material and is provided on the resistance change layer 120. In this case, the second electrode 130 may serve as an oxygen reservoir layer while acting as a top electrode (TE). A voltage having a potential difference of $V_{TE}$ with respect to the first electrode 110 may be supplied to the second electrode 130. That is, $V_{TE}$ may also be referred to as a voltage supplied to the second electrode 130 when the first electrode 110 is connected to the ground.

For example, the first electrode 110 or the second electrode 130 may include at least one material selected from Cu, Ni, Ti, Hf, Zr, Zn, W, Co, V, Al, Ag, C, Pd, Pt, ITO and the like, but is not limited thereto.

The resistance change layer 120 includes an oxide material and is provided on the first electrode 110. The resistance change layer 120 may act as a memristor layer. That is, the resistance change layer 120 may have a resistance change that occurs according to the applied voltage between the first and second electrodes 10 and 40, and may have a characteristic of storing the changed resistance values according to the applied voltage. In particular, the resistance change layer 120 may include an oxygen-containing metal oxide material to enable various resistance switching by affecting the effective SB height ΦB according to the content of oxygen ions.

In particular, the resistance change layer 120 may have the following characteristics. First, in the resistance change layer 120, a decrease in the Schottky barrier height ΦB may occur due to an increase in $V_{TE}$. In addition, a deplete phenomenon may occur in the resistance change layer 120 due to a partial applied voltage. Also, in the resistance change layer, the Fermi-energy level ($E_F$) may be changed between the valence band maximum energy level (EV) and the conduction band minimum energy level (EC), but it may maintain a metastable state. Also, in the resistance change layer 120, a decrease in the Fermi-energy level ($E_F$) may be limited according to the generation of ionized oxygen vacancies ($V_O^{2+}$) and an increase in the electron concentration when the $V_{TE}$ is increased. Also, in the resistance change layer 120, the Fermi-energy level ($E_F$) may be aligned with a peak level of oxygen vacancies $V_O$ in the density of state.

For example, the resistance change layer 120 may include a metal oxide material of three or more elements such as IGZO, ITZO, IWZO, ZSO, IZO, IGO and the like, which are capable of monolithic integration by utilizing each of the variable resistance memory devices M1 and M2 and the transistor with a single material, but is not limited thereto.

Meanwhile, an insulating layer (not illustrated) made of a non-conductive material may be formed between the first electrode 110 and the resistance change layer 120. Such an insulating layer may be formed thinner than the first electrode 110 and the resistance change layer 120. In this case, the insulating layer forms a Schottky barrier (SB), and may act as a type of tunnel barriers at the interface between the first electrode 110 and the resistance change layer 120.

In particular, the insulating layer may have the following characteristics. First, in the insulating layer, as a potentiation pulse having a predetermined maximum voltage is repeatedly provided, the Schottky barrier height ΦB may be gradually reduced. In addition, the insulating layer may include an oxide material, and the Schottky barrier height (B may be reduced according to an increase in the oxygen ion content during a potentiation pulse.

In particular, the insulating layer may be made of $SiO_2$, and in this case, the first electrode 110 and the insulating layer may be more easily implemented, by using a P-type Si wafer which is treated with an oxide film of $SiO_2$. In this case, advantages such as a simple process and low manufacturing cost may be further doubled.

Two of these memristor devices 100 are included in each synaptic device 50. To this end, each synaptic device 50 may be provided with two memristor devices M illustrated in FIG. 4. In this case, the first electrode 110 of each of the memristor devices M1 and M2 is electrically connected to each other through a separate line, and separate memory lines 31 and 41 are electrically connected to the second electrode 130 of each of the memristor devices M1 and M2. That is, the first memory line 31 is electrically connected to the second electrode 130 of M1 to apply a first memory signal, and the second memory line 41 is electrically connected to the second electrode 130 of M2 to apply a second memory signal.

Meanwhile, each synaptic device 50 may be provided with one memristor device 2M illustrated in FIGS. 5A-5B, and the corresponding one memristor device 2M may structurally play a role of two memristor devices M1 and M2. That is, in the case of FIG. 5A, the first electrode 110 and the resistance change layer 120 are formed in one global structure, and the two second electrodes 130a and 130b are formed to be spaced apart from each other on the corresponding structure. In the case of FIG. 5B, the first electrode 110 is formed globally, and the two resistance change layers 120 and the two second electrodes 130a and 130b may be formed to be spaced apart from each other on the first electrode 110.

When each synaptic device 50 is provided with one memristor device 2M illustrated in FIG. 5, since the first electrodes 110 of M1 and M2 are already electrically connected, the second electrode 130a of M1 is electrically connected to the first memory line 31 to apply a first memory signal, and the second memory line 41 is electrically connected to the second electrode 130b of M2 to apply a second memory signal.

That is, considering the simplification and cost of the process, the memristor device 2M of FIGS. 5A-5B may be more suitable than two memristor devices M of FIG. 4. In addition, considering the simplification and cost of the process and also considering the independent resistance modulation of the resistance change layer 120 in M1 and M2, the case of FIG. 5B may be the most optimal, but the present invention is limited thereto.

Hereinafter, for convenience, the first electrode 110 may be referred to as "BE", and the second electrode 130 may be referred to as "TE". In addition, BE and TE of M1 may be referred to as "BE1" and "TE1", and BE and TE of M2 may be referred to as "BE2" and "TE2", respectively.

The transistor T adjusts a synaptic output signal which is output to the source electrode S or the drain electrode D according to the gate voltage $V_{GS}$ applied to the gate electrode G. That is, in the transistor T, any one of the source electrode S and the drain electrode D is electrically connected to the input line 11, and the other one is electrically connected to the output line 21. For example, when the transistor T is N-type, the drain electrode D may be connected to the input line 11 and the source electrode S may be connected to the output line 21, respectively, and the output signal may be referred to as "$I_{DS}$." In addition, when the transistor T is P-type, the source electrode S may be connected to the input line 11, and the drain electrode D may be connected to the output line 21, respectively, and the output signal may be referred to as "$I_{SD}$." However, hereinafter, the transistor T will be described as an N-type transistor, but the present invention is not limited thereto.

In this case, the gate electrode G is electrically globally connected to BE1 and BE2 of each of the variable resistance memory devices M1 and M2. Accordingly, each of the variable resistance memory devices M1 and M2 may adjust the gate voltage applied to the gate electrode while the resistance thereof (conductance) is modulated according to the first and second memory signals applied to TE1 and TE2, respectively. As a result, a synaptic output signal which is output to the other one of the source and drain electrodes S and D may be controlled according to the corresponding gate voltage.

For example, the transistor T may be made of various field effect transistors such as a junction field effect transistor (FET), a metal oxide semiconductor FET (MOSFET) and the like, but is not limited thereto.

Figure 6:
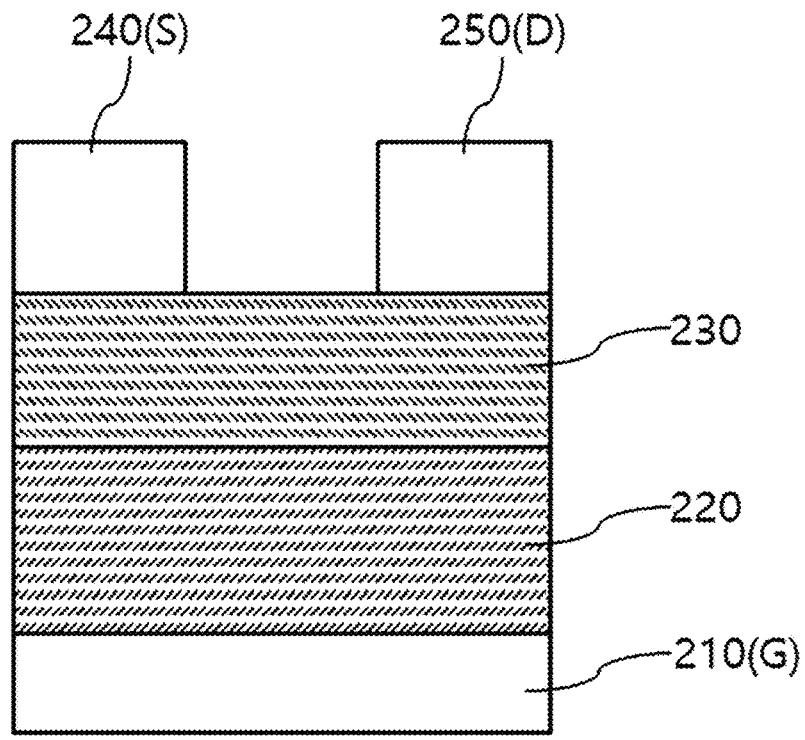
FIG. 6 shows an example of the configuration of a transistor 200 applicable to the synapse of a neuromorphic device according to an exemplary embodiment of the present invention.

FIG. 6 shows an example of the configuration of a transistor 200 applicable to the synapse of a neuromorphic device according to an exemplary embodiment of the present invention.

Referring to FIG. 6, the transistor 200 may include a gate electrode 210, a gate insulating layer 220, a channel material layer 230, a source electrode 240 and a drain electrode 250.

The gate electrode 210, the source electrode 240 or the drain electrode 250 includes a conductive material. The source electrode 240 or the drain electrode 250 may be provided on the channel material layer 230. For example, the gate electrode 210, the source electrode 240 or the drain electrode 250 may include at least one material selected from Cu, Ni, Ti, Hf, Zr, Zn, W, Co, V, Al, Ag, C, Pd, Pt, ITO and the like, but is not limited thereto.

However, the gate electrode 210 may be made of a high concentration of P-type Si ($p^+$ Si). In this case, since the gate electrode 210 may act as a conductive substrate that is both a base and an electrode, it has advantages such as a simple process and low manufacturing cost, compared to a conventional transistor in which a separate base substrate and an electrode must be implemented separately.

The gate insulating layer 220 includes a non-conductive material, and may be formed on the gate electrode 210 to be thicker than the channel material layer 230. It may act as a type of tunnel barriers at the interface between the source and drain electrodes 240 and 250.

In particular, the gate insulating layer 220 may be made of $SiO_2$. In this case, the gate electrode 210 and the gate insulating layer 220 may be more easily implemented by using a P-type Si wafer which is treated with an oxide film of $SiO_2$.

The channel material layer 230 includes an oxide material, and may be provided on the gate insulating layer 220 to form a channel layer between the source and drain electrodes 240 and 250. Such a channel layer may be changed according to the gate voltage. The channel material layer 230 may include a metal oxide material of three or more elements such as IGZO, ITZO, IWZO, ZSO, IZO, IGO and the like, which are capable of monolithic integration by utilizing each of the variable resistance memory devices M1 and M2 and the transistor with a single material, but is not limited thereto.

In particular, similar to indium-gallium-zinc-oxide transistors (IGZO transistors) and the like, transistors 200 in which the channel material layer 230 include a metal oxide material of three elements or more (e.g., IGZO, ITZO, IWZO, ZSO, IZO, IGO, etc.) have a lower leakage current and a higher on/off current ratio than those of silicon transistors. In this case, since a high on/off current ratio may be obtained with a small change in the gate voltage, it may be more advantageous to secure multi-levels.

Figure 7:
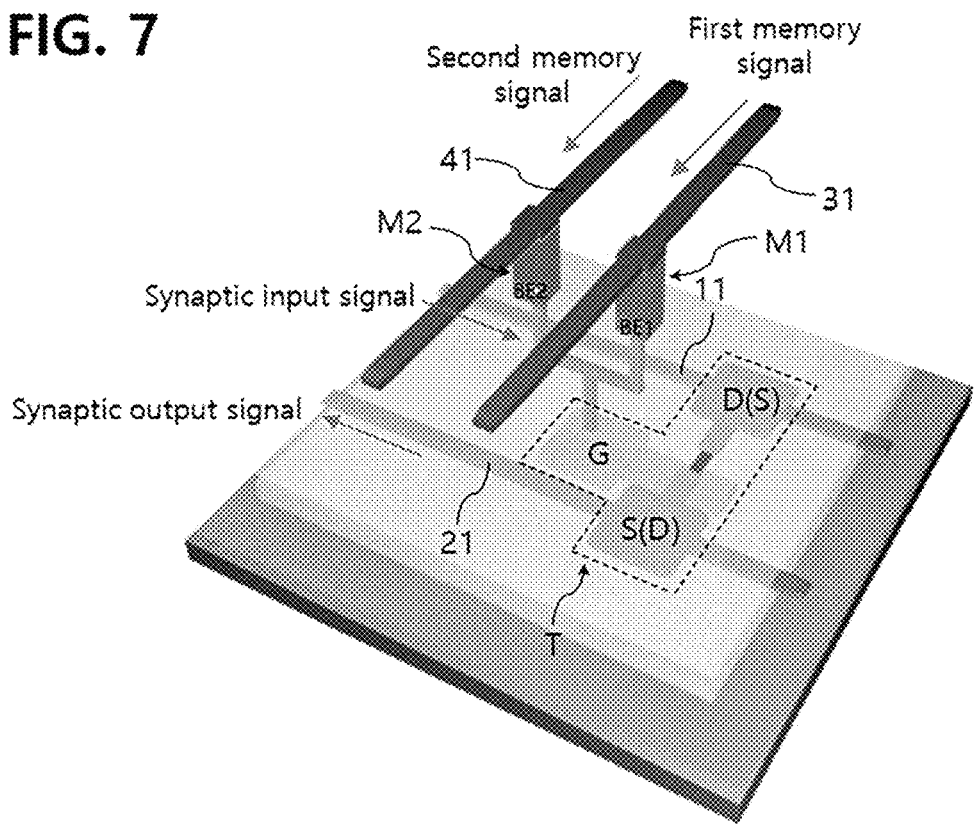
FIGS. 7 and 8 show various examples of implementing the synapse of a neuromorphic device in a crossbar array structure according to an exemplary embodiment of the present invention.
Figure 8:
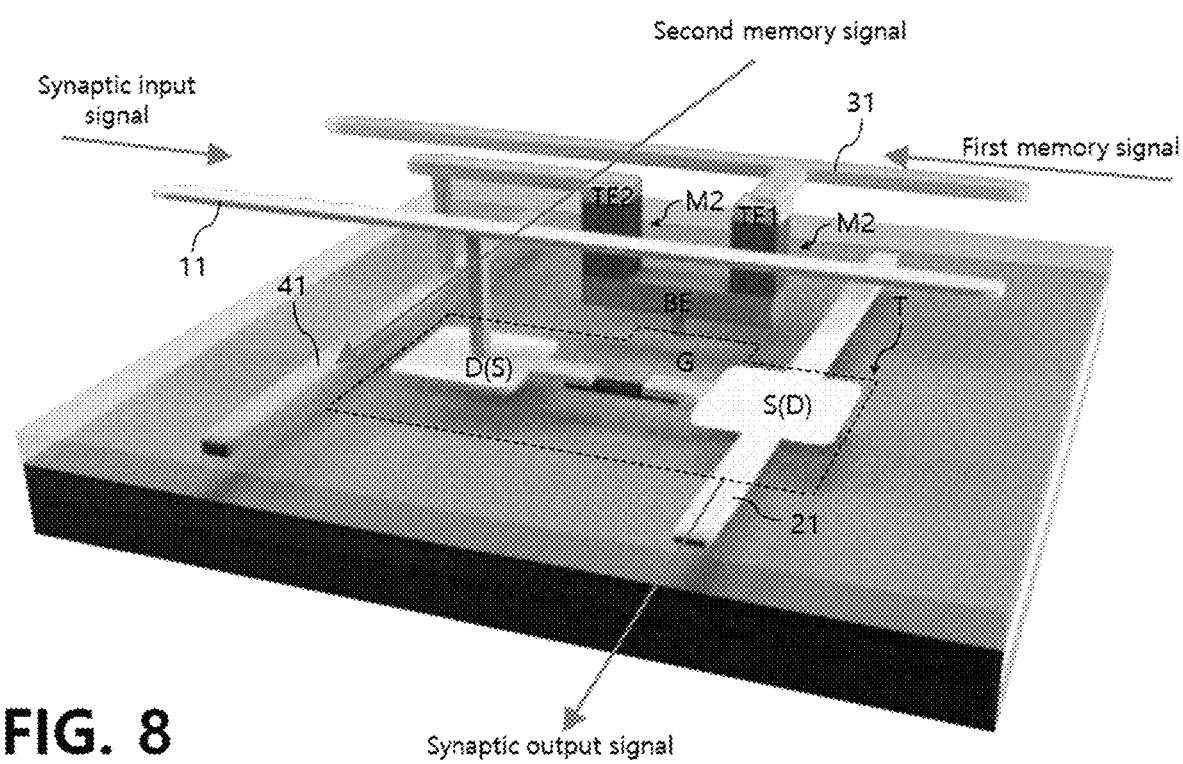

FIGS. 7 and 8 show various examples of implementing the synapse of a neuromorphic device in a crossbar array structure according to an exemplary embodiment of the present invention. However, FIG. 7 shows an example of implementation using two variable memory devices M of FIG. 4, and FIG. 8 shows an example of implementation using one variable memory device 2M of FIG. 5B.

The synaptic array according to an exemplary embodiment of the present invention may be implemented in a crossbar array structure, as illustrated in FIGS. 7 and 8. That is, each of the lines 11, 21, 31 and 41 may be formed in a bar shape crossing each other. That is, the input line 11 and the second memory line 41 may be arranged parallel to each other, and the output line 21 and the first memory line 31 may be arranged parallel to each other. In addition, the input line 11 and the second memory line 41 may be arranged to cross the output line 21 and the first memory line 31. In this case, the synaptic device 50 may be provided in each cross region.

Meanwhile, in order to implement a neuromorphic system with low power consumption and high-speed operation, accurate cognitive task execution, excellent reliability and the like, various requirements for synaptic devices must be satisfied. First, low operating energy, fast operating speed, excellent cycle endurance, long-term data retention, small modulation (between each cycle and between each device), small device size and the like, which are characteristics favored in a conventional non-volatile memory (NVM), must be satisfied. Besides, the synaptic device must meet a much higher multi-level precision (e.g., 256 levels or more) than a typical NVM in order to achieve the desired learning accuracy.

In particular, in the learning process of a neuromorphic system, the relationship between the conductance of a synaptic device and the number of programming pulses should be linear, and the potentiation and depression of conductance should be symmetrical for the accurate update of the synaptic device. However, the synaptic device implemented with a conventional memristor showed a nonlinear and asymmetrical behavior in conductance modulation. That is, as the conductance modulation achieved symmetry, the nonlinearity became more pronounced, and as the linearity was achieved, the asymmetry became more pronounced.

Conventionally, in order to solve such a nonlinearity problem, the incremental-step-pulse programming (ISPP) method, which is a general programming method of the conventional NAND flash memory, was used. However, the ISPP system inevitably takes a significant amount of time and energy due to the additional verification step, and it places a significant burden on the peripheral circuits. Therefore, realizing the linearity and symmetry of conductance modulation at the synaptic device level may be a better solution.

Meanwhile, the synaptic device using a conventional memristor is implemented in a crossbar array structure, and the input and output signals of a synapse are processed through the memristor. As a result, the synaptic device using a conventional memristor has a problem in that a sneak path occurs.

Accordingly, the present invention proposes a technique for solving the problem of the nonlinearity and asymmetry of conductance of the variable resistance memory device and the problem of a sneak path at the synaptic device level.

That is, the synaptic device 50 according to an exemplary embodiment of the present invention may satisfy the linearity and symmetry of conductance modulation and restrict a sneak path through 2M1T described above with reference to FIGS. 1 to 8. Hereinafter, the specific operation of the synaptic device 50 according to an exemplary embodiment of the present invention will be described based on an experiment using an actually fabricated synapse.

<Fabrication and Experiment of Synaptic Device 50>

For the experiment, a synaptic device 50 in a 2M1T structure, in which the memristor 2M of FIGS. 5A-5B and the transistor T of FIG. 6 are connected as shown in FIGS. 2 and 3, was manufactured as follows.

First, a silicon substrate doped with $P^+$ ($P^+$—Si substrate) was prepared. In this case, the $P^+$—Si substrate may serve as a first electrode 110 BE of the memristor 2M and a gate electrode G of the transistor T at the same time.

Afterwards, for the fabrication of a memristor 2M, by using the high-frequency (RF) magnetron sputtering (about 150 W) deposition method in an $Ar/O_2$ (3/2 sccm) atmosphere, an amorphous IGZO film with a thickness of about 80 nm was deposited on one surface of $P^+$—Si. In this case, IGZO corresponds to a resistance change layer 120. Subsequently, by using e-beam evaporation, a Pd layer with a thickness of about 40 nm was deposited on the IGZO and patterned to form each top electrode having an area of about 100-100 $\mu m^2$. In this case, each top electrode patterned with the Pd layer corresponds to two second electrodes 130a and 130b (TE1, TE2). That is, the memristor 2M having a structure corresponding to FIG. 5A was fabricated.

In addition, in order to fabricate a transistor T (W/L=50 µm/50 µm), a $SiO_2$ film with a thickness of about 50 nm was formed on the other surface of the $P^+$—Si substrate by using a thermal oxidation process. In this case, $SiO_2$ corresponds to a gate insulating layer 220. Subsequently, IGZO with a thickness of about 40 nm was deposited by using an Ar flux of about 3 sccm and an $O_2$ flux of about 0.3 sccm by the RF sputtering method. In this case, IGZO corresponds to a channel material layer 230. Finally, for the source and drain regions, Ti layers spaced apart from each other with a thickness of about 40 nm were deposited by electron beam deposition using a metal shadow mask. In this case, each Ti layer corresponds to source and drain electrodes S and D.

Meanwhile, for comparison, one memristor M according to FIG. 4 was also fabricated. Hereinafter, the corresponding memristor may be referred to as 1M for convenience. The electrical properties of the fabricated devices were measured using the Keithley 4200 semiconductor parameter analyzer. In this case, X-ray photoelectron spectroscopy (XPS) analysis was performed using the Thermo Scientific K-Alpha spectrometer operating at 200 eV as an Al Kα radiation source.

Figure 9A:
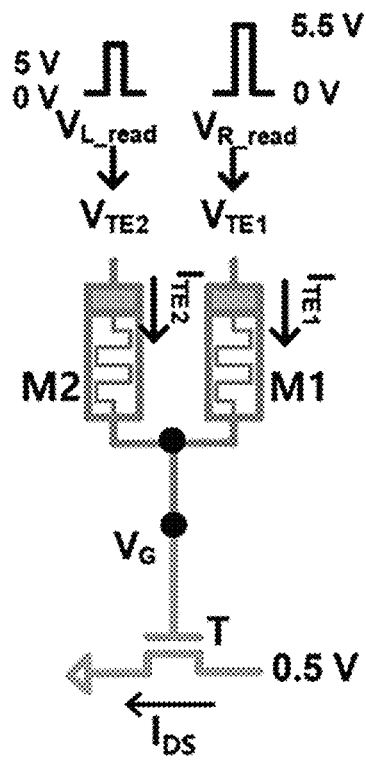
FIGS. 9A-9C shows conceptual diagrams for various operation modes of the synaptic device 50 according to an exemplary embodiment of the present invention.
Figure 9B:
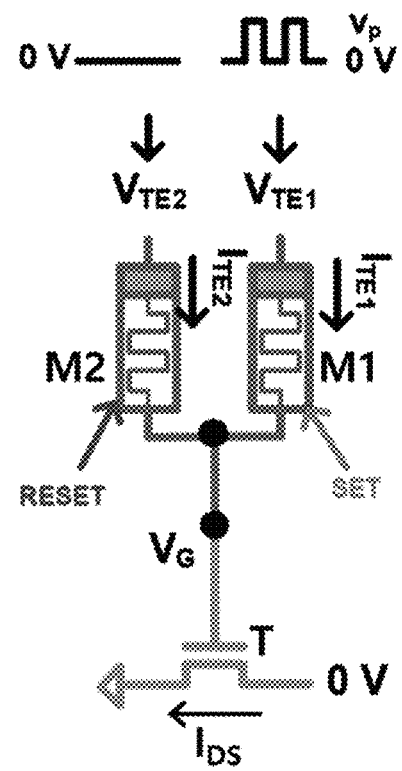
Figure 9C:
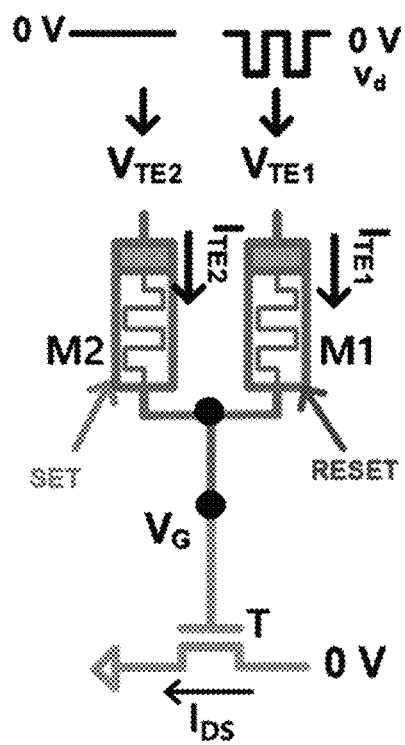

FIGS. 9A-9C show conceptual diagrams for various operation modes of the synaptic device 50 according to an exemplary embodiment of the present invention. That is, FIG. 9A shows an operation in the reading mode, FIG. 9B shows an operation in the potentiation learning mode, and FIG. 9C shows an operation in the depression learning mode.

A conventional memristor-based cross-point array architecture is vulnerable to a sneak path problem. This is because synaptic input/output signals are processed through memristors. However, in the fabricated synaptic device 50 of a synaptic array according to an exemplary embodiment of the present invention, the IGZO-based memristor (2M) was disposed on the side of the gate electrode G of the IGZO-based transistor (T). In this case, the synaptic input signal (voltage signal) and the synaptic output signal (current signal) are applied to the transistor T, not the memristor 2M. As a result, the synaptic device 50 according to an exemplary embodiment of the present invention has an advantage of preventing a sneak path.

In FIGS. 9A-9C, each memristor 2M is denoted by M1 and M2. As illustrated in FIG. 9A, during the reading mode, constant read voltages $V_{L\_READ}$ and $V_{R\_READ}$ are applied to the upper electrodes TE1 and TE2 of the memristor 2M, respectively. Hereinafter, voltages applied to the upper electrodes TE1 and TE2 of each memristor 2M will be referred to as $V_{TE1}$ and $V_{TE2}$, respectively, and these may correspond to first and second memory signals.

Meanwhile, M1 and M2 of the memristor 2M serve as voltage dividers for the gate voltage $V_G$ of the transistor T. Accordingly, $V_G$ may be expressed as Formula (1) below.

$$V_G = V_{TE2} + (V_{TE1} - V_{TE2}) \times \frac{1}{1 + \frac{G_2}{G_1}} \quad (1)$$

Herein, G1 and G2 are the conductance values of M1 and M2, respectively.

When the synaptic input signal is applied to the drain $V_D$, the synaptic output signal $I_{DS}$ is controlled by the gate voltage VG. In this case, $I_{DS}$ may be expressed as Formula (2) below.

$$I_{DS} = \mu_{eff} C_{ox} \frac{W}{L} \times (V_G - V_T) \times V_D \quad (2)$$

Herein, $\mu_{eff}$ is the effective mobility of the transistor T, $C_{ox}$ is the gate oxide capacitance of the gate insulating layer 220, W is the effective channel width of the channel material layer 230, L is the effective channel length of the channel material layer 230, and $V_T$ is a threshold voltage.

Assuming that the transistor T operates in the linear region, the conductance G of the fabricated 2M1T synaptic device 50 may be expressed as Formula (3) below.

$$G = \mu_{eff} C_{ox} \frac{W}{L} \left[ \left( V_{TE2} + (V_{TE1} - V_{TE2}) \times \frac{1}{1 + \frac{G_2}{G_1}} \right) - V_T \right] \quad (3)$$

Herein, G1 is the conductance of M1, and G2 is the conductance of M2. That is, the conductance G (or the total conductance of M1 and M2) of the fabricated synaptic device 50 is determined by the conductance ratio ($G_2/G_1$) of the two memristors M1 and M2.

As illustrated in FIGS. 9B and 9C, during the learning mode, a constant DC bias ($V_{DC}$) is applied to both of the second electrodes TE1 and TE2 of M1 and M2, and the same potentiation pulses $V_p$ or depression pulses $V_d$ are additionally applied to only one TE (i.e., TE1). In this case, the voltage of the global first electrode BE of M1 and M2 has an intermediate value between $V_{TE1}$ and $V_{TE2}$, which may be determined by Formula (1).

When the potentiation pulse $V_p$ is applied to $V_{TE1}$, in the case of M1, $G_1$ increases due to the SET operation, whereas in the case of M2, $G_2$ decreases due to the RESET operation. As a result, the conductance G of the synaptic device 50 increases. Meanwhile, when $V_{TE2}$ of the depression pulse $V_d$ is applied to TE2, in the case of M1, $G_1$ decreases due to the SET operation, and in the case of M2, $G_2$ increases due to the RESET operation. As a result, the conductance G of the synaptic device 50 is reduced. These SET and RESET operations are used to potentiate or depress the memristor 2M. In this way, as the SET operation occurs in any one of M1 and M2 and the RESET operation occurs in the other one, the linearity and symmetry of potentiation and depression may be improved. The detailed contents therefor will be described below based on the response result for the input pulse.

Figure 10A:
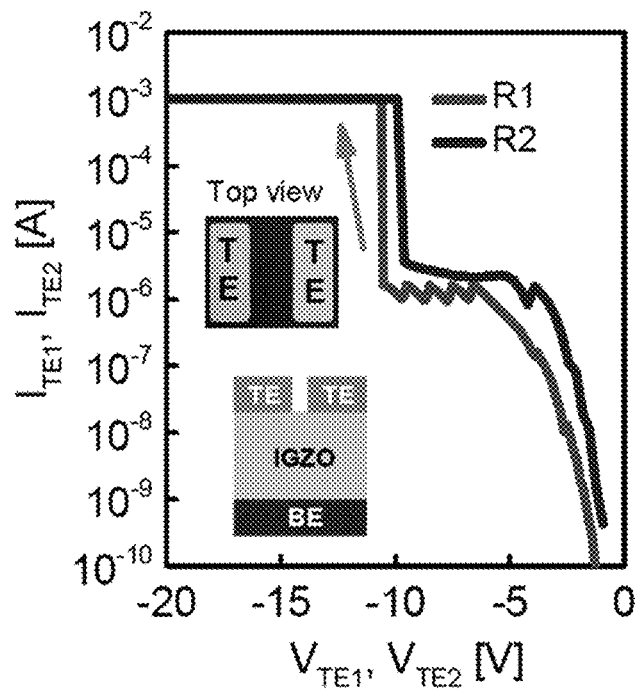
FIGS. 10A-10B shows graphs of the forming process and bipolar resistive switching characteristic of an actually fabricated synaptic device 50 according to an exemplary embodiment of the present invention.
Figure 10B:
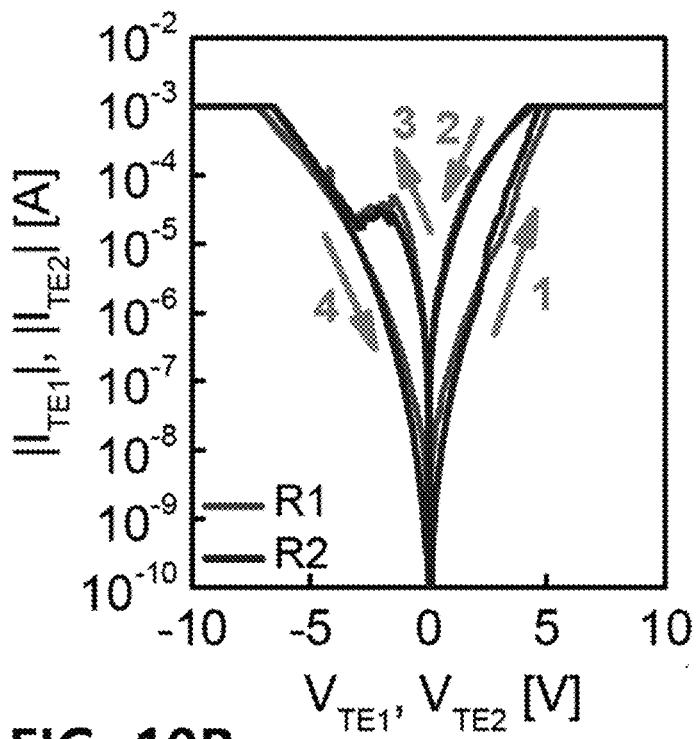

FIGS. 10A-10B show graphs of the forming process and bipolar resistive switching characteristic of an actually fabricated synaptic device 50 according to an exemplary embodiment of the present invention.

The memory characteristics of the fabricated memristor 2M are illustrated in FIGS. 10A-10B. In the initial forming process, as illustrated in FIG. 9A, a negative bias (−10V) was applied as a memory signal to the memristor 2M. Interestingly, after the forming process, the memristor 2M was found to be in a high-resistance state (HRS) rather than a low-resistance state (LRS). After the forming process, as illustrated in FIG. 9B, typical bipolar resistive switching was observed. The SET process occurs at a positive (+) bias, and the RESET process occurs at a negative (−) bias. However, in order to prevent permanent failure of the memristor 2M, the conduction current during measurement was limited to a compliance current of 1 mA.

Figure 11A:
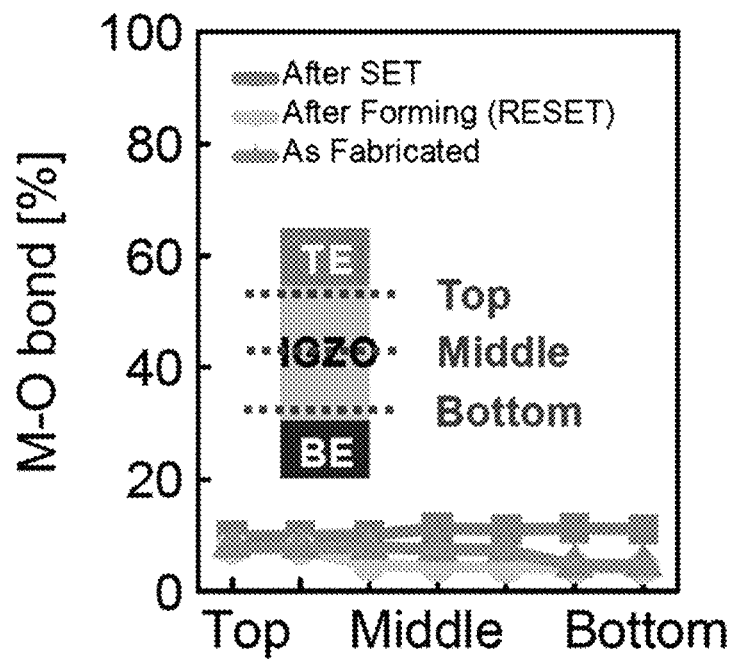
FIGS. 11A-11J show analysis results according to X-ray photoelectron spectroscopy (XPS) for an actually fabricated synaptic device 50 according to an exemplary embodiment of the present invention.
Figure 11B:
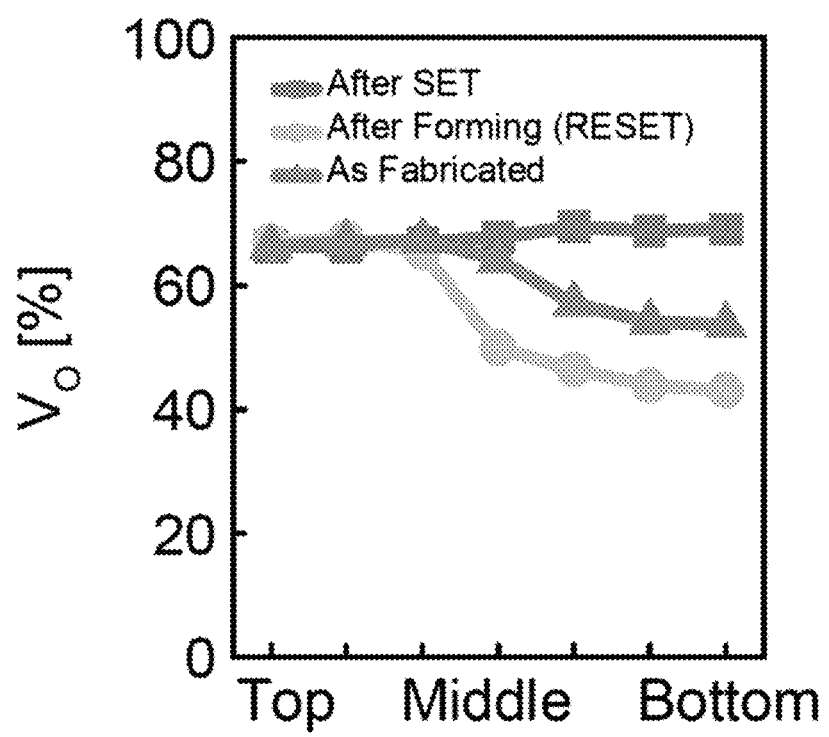
Figure 11C:
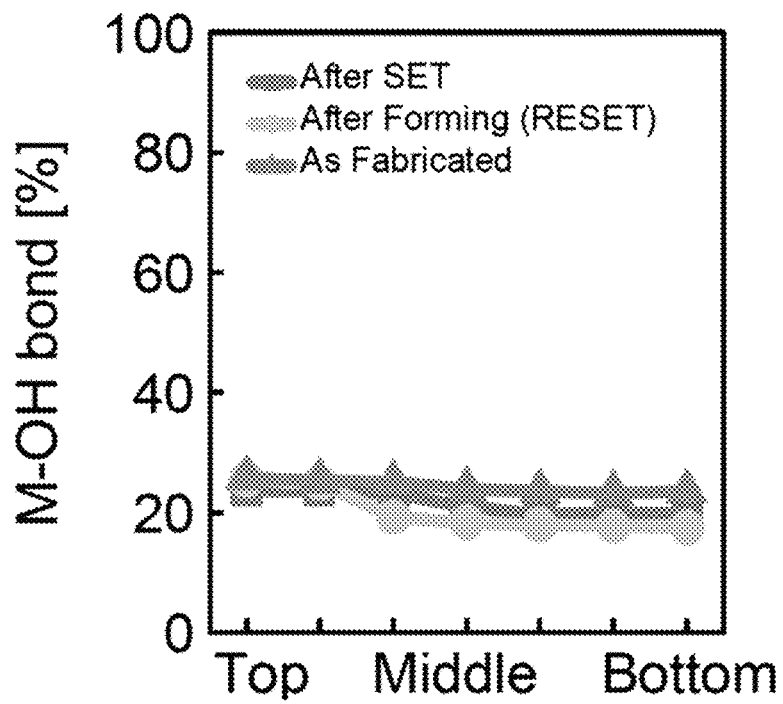
Figure 11D:
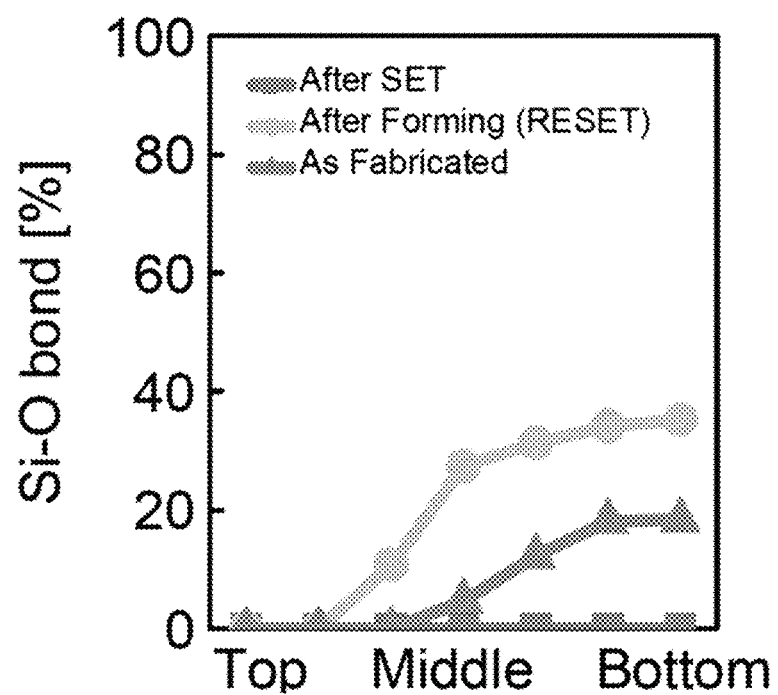
Figure 11E:
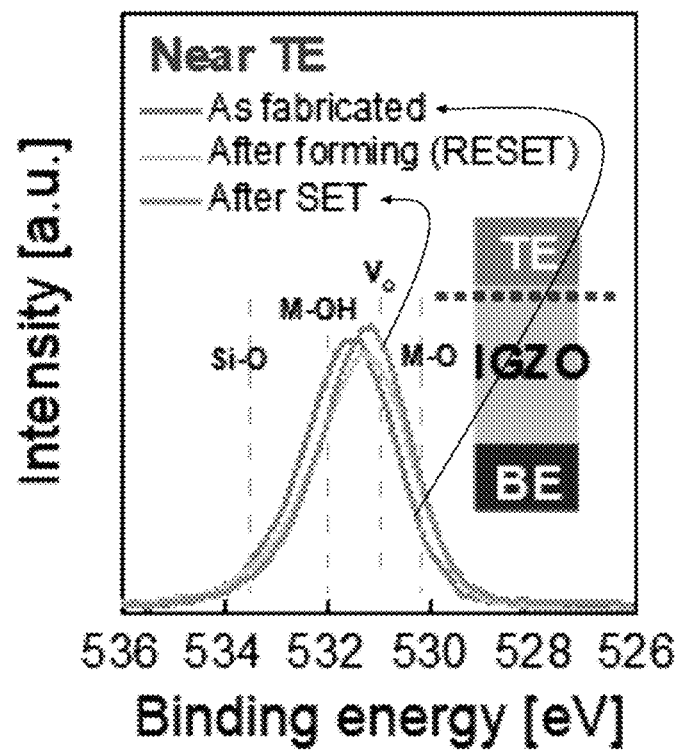
Figure 11F:
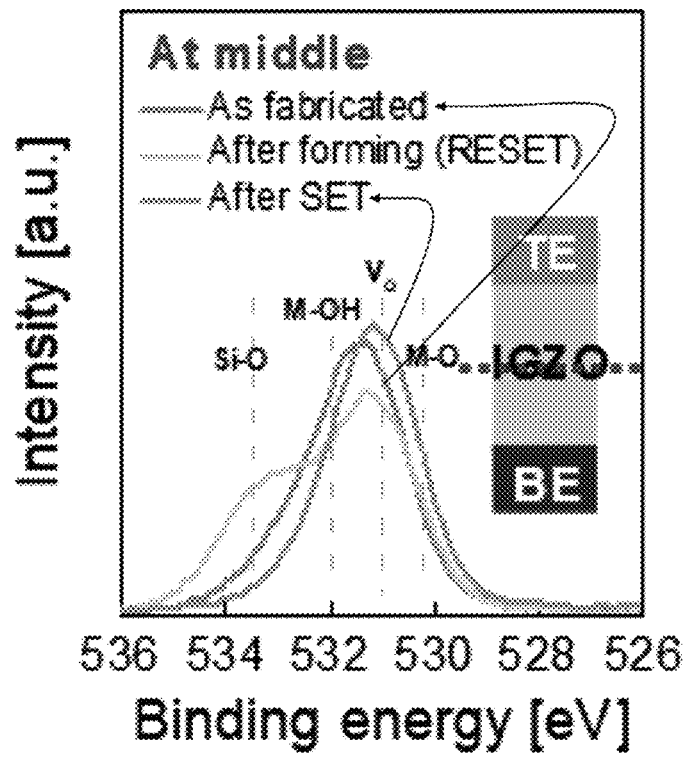
Figure 11G:
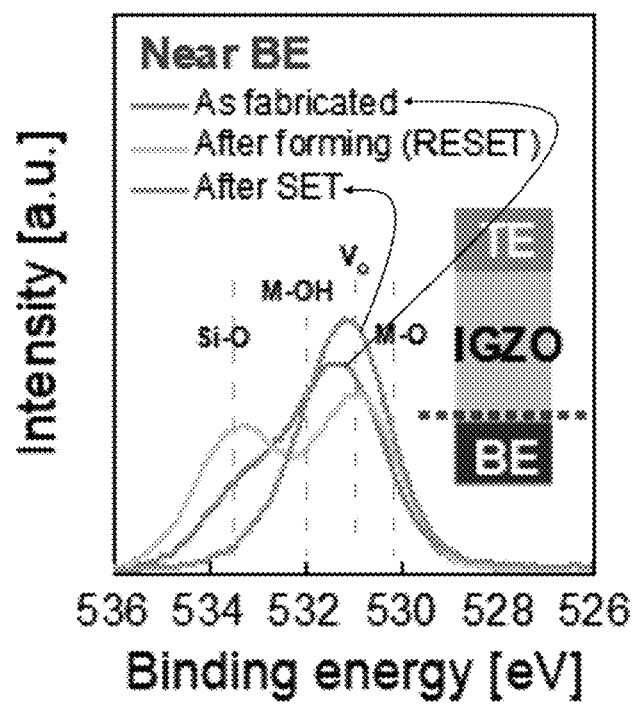
Figure 11H:
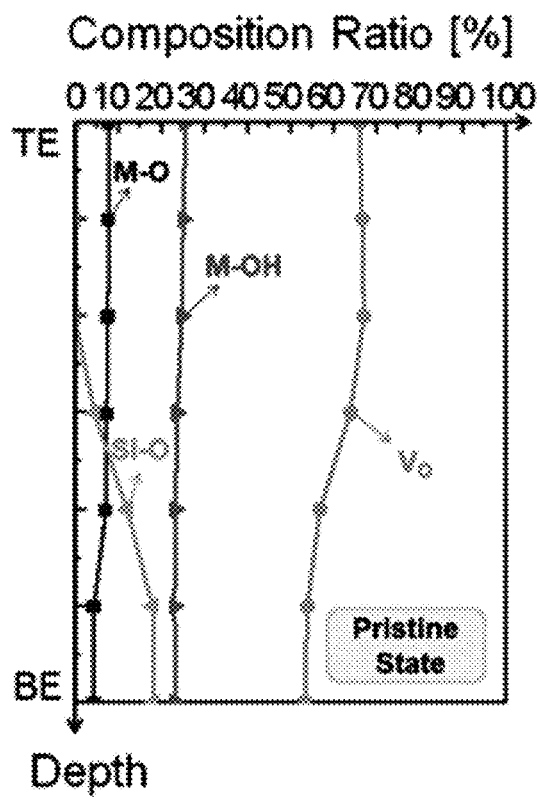
Figure 11I:
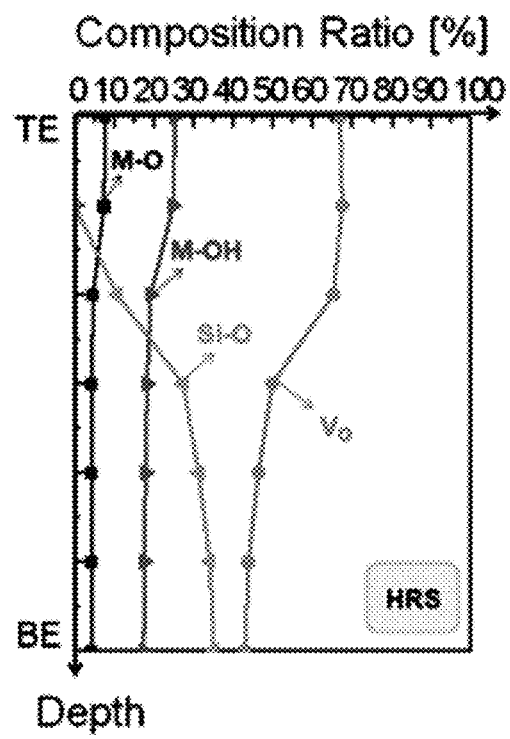
Figure 11J:
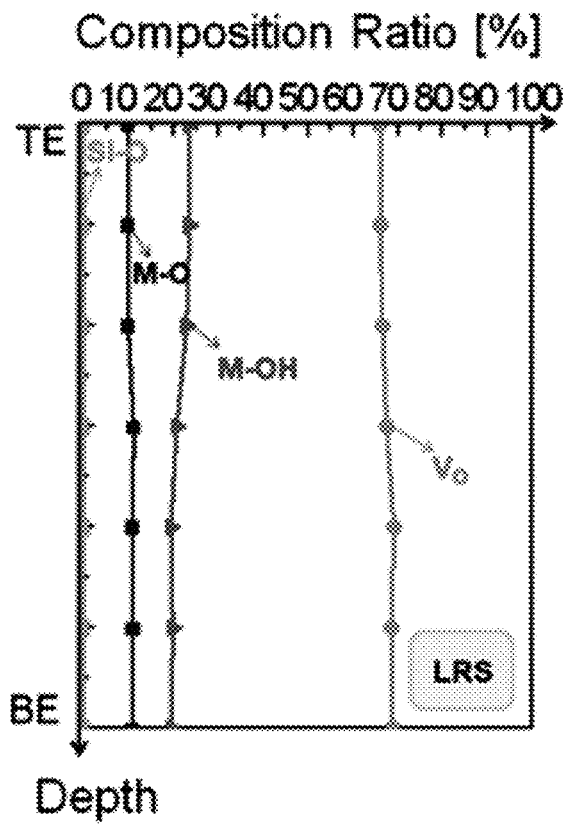

FIGS. 11A-11J show analysis results according to X-ray photoelectron spectroscopy (XPS) for an actually fabricated synaptic device 50 according to an exemplary embodiment of the present invention. That is, FIG. 11A, FIG. 11B, FIG. 11C and FIG. 11D show various bonds (Top, Middle, Bottom) and the distribution of oxygen vacancies ($V_O$) of the actually fabricated memristor device 100. In this case, Top indicates the vicinity of TE, Middle indicates the vicinity of the middle of IGZO, and Bottom indicates the vicinity of BE, respectively. In addition, FIG. 11E, FIG. 11F and FIG. 11G show XPS profiles of the O 1s core level. That is, FIG. 11E shows the XPS peak near TE, FIG. 11F shows the XPS peak near the middle of IGZO, and FIG. 11G shows the XPS peak near BE, respectively. In addition, FIG. 11H shows a depth profile in a pristine state, and FIG. 11I shows a high-resistance state (HRS) (i.e., after the forming process or RESET process), and FIG. 11J shows a depth profile in a low resistance state (LRS) (i.e., after the SET process), respectively.

In order to analyze the resistive switching mechanism, X-ray photoelectron spectroscopy (XPS) analysis was performed. FIG. 11E, FIG. 11F and FIG. 11G show O 1s XPS peaks in the vicinity of TE, the middle region and the BE region, respectively. The O 1s peaks may be classified as a metal-oxygen (M-O) bond at 530.2 eV, an oxygen vacancy ($V_o$) at 531 eV, a metal-hydroxide (M-OH) bond at 532 eV and a silicon-oxide (Si—O) bond at 533.4 eV. FIG. 11H, FIG. 11I and FIG. 11J show the depth profiles of the O 1s core-level spectra for each case where the memristor 2M is in a fabricated state (pristine state), HRS (after the forming or RESET process) and LRS (after the SET process).

Referring to FIGS. 11A-11J, XPS data indicates that the main switching operation of the memristor 2M occurs near the first electrode BE. It is known that the native oxide in the first electrode BE of the memristor 2M in the pristine state is unstable due to the ion bombardment effect by Ar plasma during the IGZO sputtering fabrication step. As illustrated in FIG. 11H, the Si—O peak at the first electrode BE is relatively high. This phenomenon suggests that the silicon oxide of BE is an insulating film having a large Si dangling bond. During the forming process, oxygen ions ($O^{2-}$) migrate to the bottom electrode and form Si—O bonds (passivate the Si dangling bonds) at the Si interface.

Afterwards, as illustrated in FIG. 11I, a more stable silicon oxide is formed in BE, and the memristor 2M is in a state of HRS rather than LRS after the forming process. In addition, after the RESET switching process in which a negative bias is applied to the bias of the TE, the memristor 2M enters HRS by the same mechanism as the forming process. Meanwhile, during the set switching process, oxygen ions migrate from BE to IGZO. As a result, the number of Si—O bonds in the BE region decreases.

Figure 12:
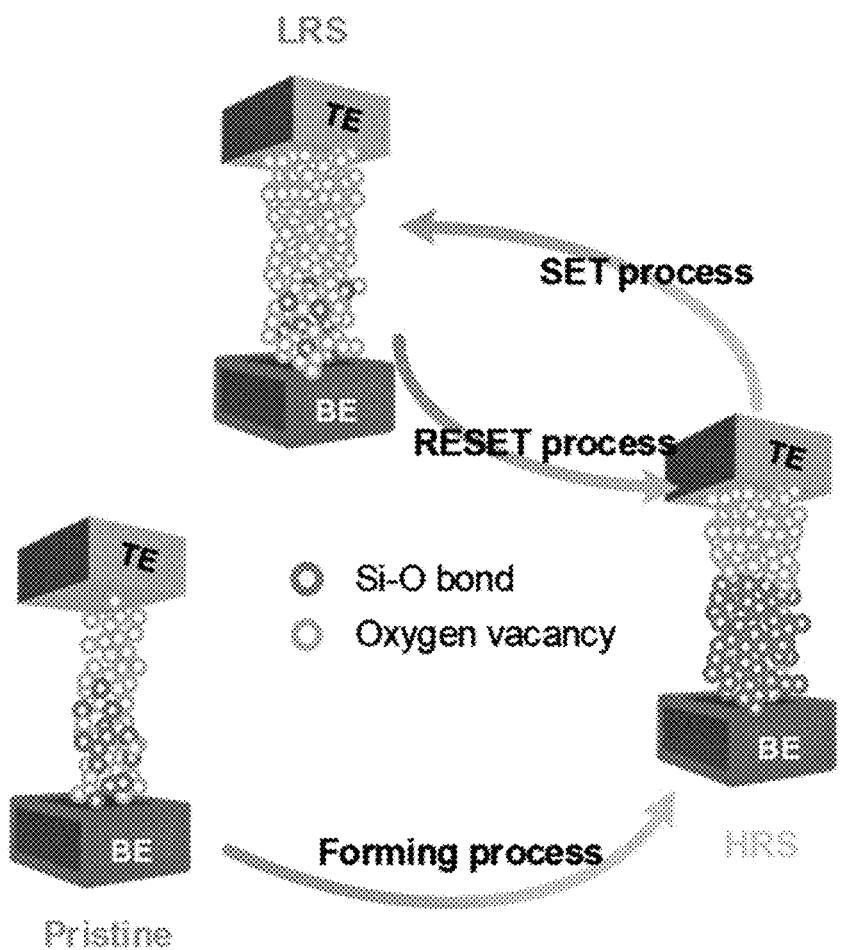
FIG. 12 shows a conceptual diagram of the switching mechanism of an actually fabricated memristor device 100 according to an exemplary embodiment of the present invention.

Meanwhile, as illustrated in FIG. 11J, the number of oxygen vacancies ($V_o$) increases in BE and IGZO. The Si dangling bonds (a type of oxygen vacancies) at the bottom electrode and oxygen vacancies in the IGZO form a conductive path, allowing the memristors (2M) to enter the LRS. A schematic diagram of this conversion process is illustrated in FIG. 12. That is, FIG. 12 shows a conceptual diagram of the switching mechanism of an actually fabricated memristor device 100 according to an exemplary embodiment of the present invention.

Figure 13A:
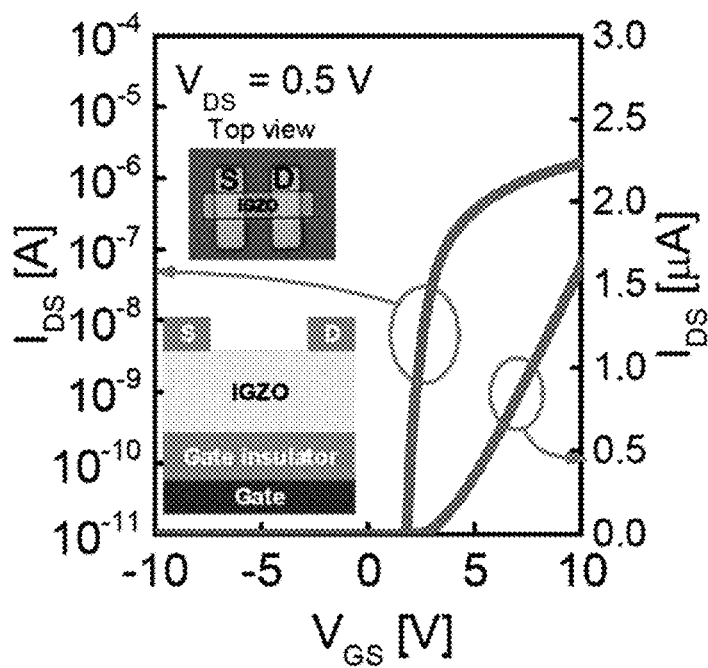
FIGS. 13A-13B show voltage-current characteristic graphs of an actually fabricated transistor 200 according to an exemplary embodiment of the present invention.
Figure 13B:
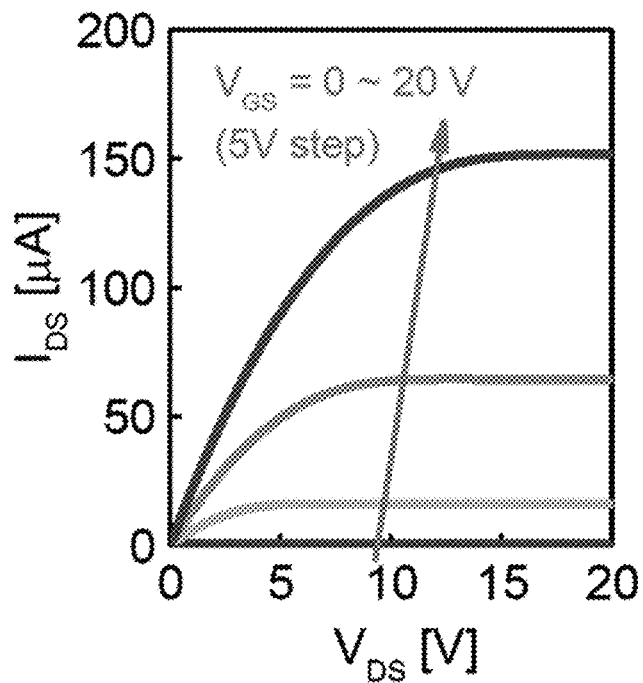

FIGS. 13A-13B show voltage-current characteristic graphs of an actually fabricated transistor 200 according to an exemplary embodiment of the present invention.

Transmission characteristics and output characteristics of the fabricated IGZO-based transistor T are illustrated in FIGS. 13A and 13B, respectively. The transistor T operates in a linear region (VD: 0V to 5V) for synaptic application.

Figure 14A:
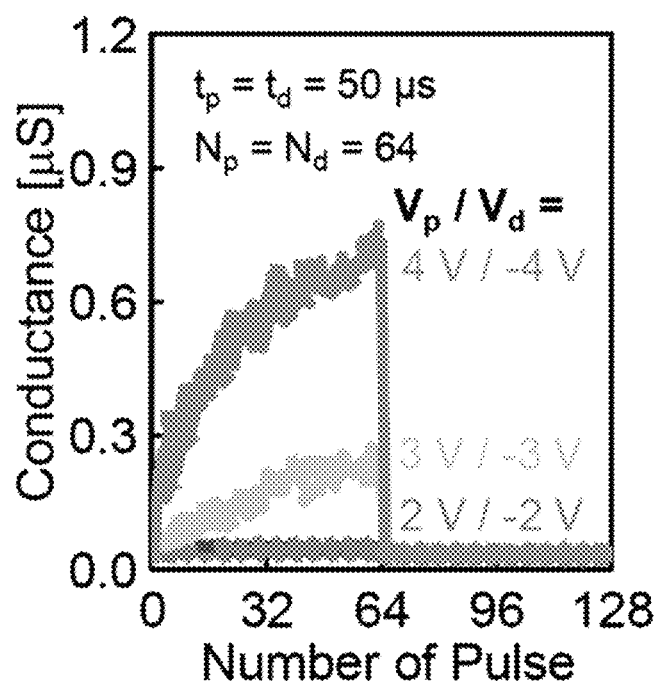
FIGS. 14A-14I show input results of various pulses for one memristor 1M of FIG. 4 and the memristor 2M of FIGS. 5A-5B.
Figure 14B:
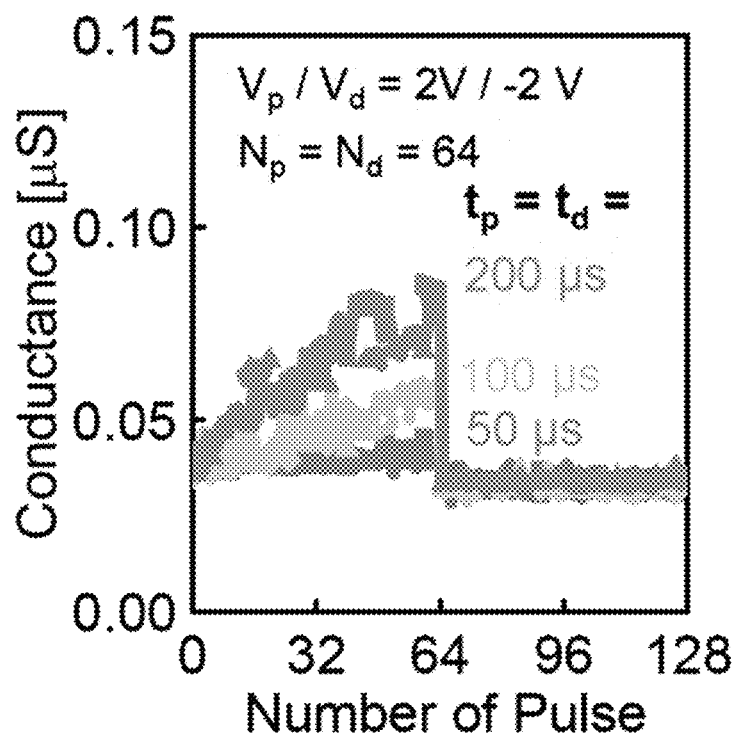
Figure 14C:
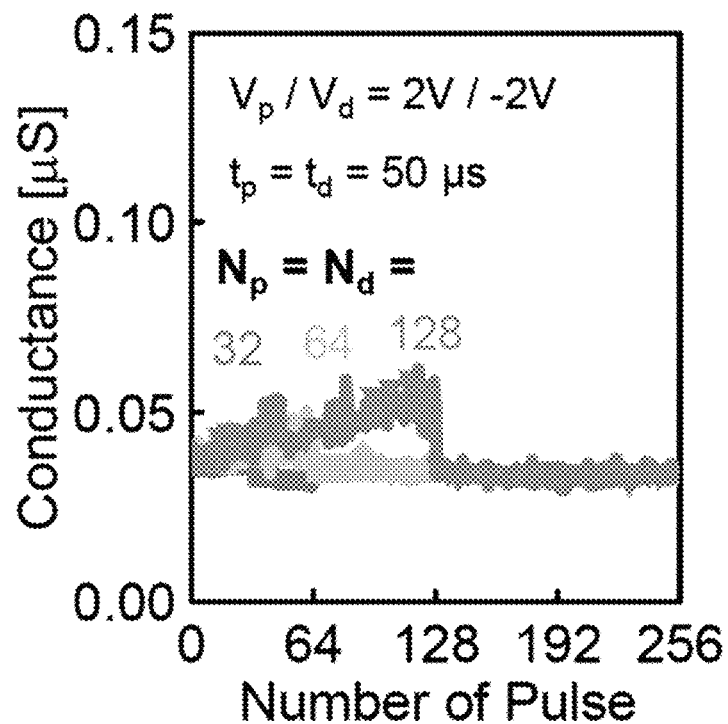

FIGS. 14A-14I show input results of various pulses for various actually fabricated memristors. That is, FIGS. 14A to 14C show the results for one memristor 1M fabricated in the structure of FIG. 4, and FIGS. 14D to 14I show the results for the synaptic device 50 of 2M1T fabricated in the structure of FIGS. 5A-5B and 6, respectively. In order to measure the cell conductance, a read voltage of 0.5 V was used. In addition, $V_p$ and $V_d$ represent the pulse amplitudes of potentiation and depression pulses, $T_p$ and $T_d$ represent the pulse widths (time) of potentiation and depression pulses, and $N_p$ and $N_d$ represent the maximum numbers of applied pulses of the potentiation and depression pulses, respectively.

Specifically, FIG. 14A shows changes in conductance according to the potentiation and depression processes in which each pulse having three types of pulse amplitudes (4V/−4V, 3V/−3 and 2V/−2V) is input to 1M as a memory signal, FIG. 14B shows changes in conductance according to the potentiation and depression processes in which each pulse having three types of pulse widths (200 μs, 100 μs and 50 μs) is input as a memory signal to 1M, and FIG. 14C shows changes in conductance according to the potentiation and depression processes in which each pulse having three types of the maximum number of pulses (128, 64 and 32) is input to 1M as a memory signal.

Figure 14D:
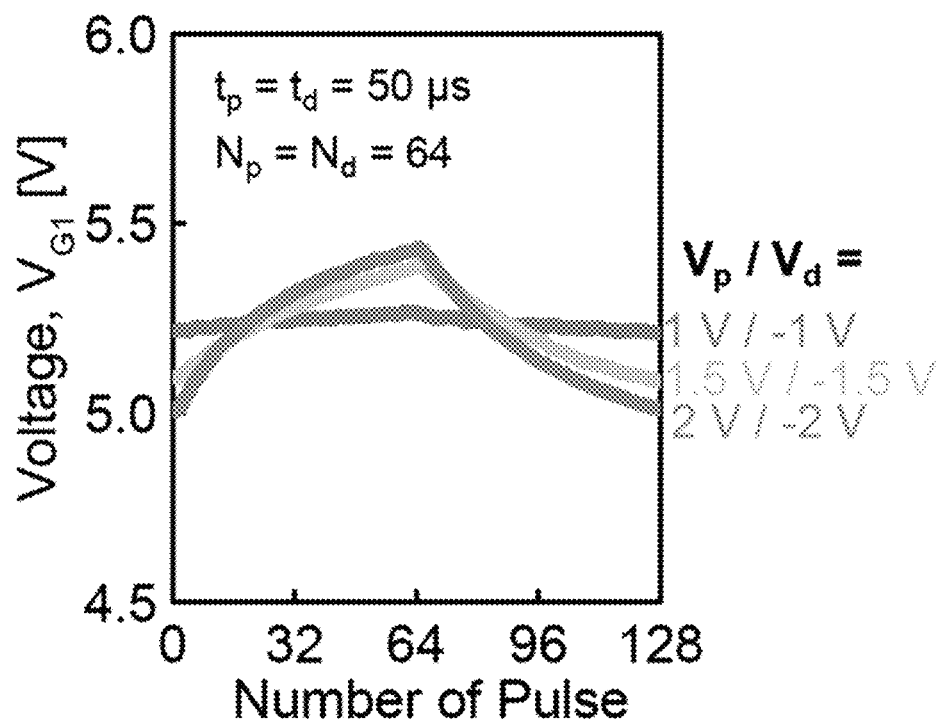
Figure 14E:
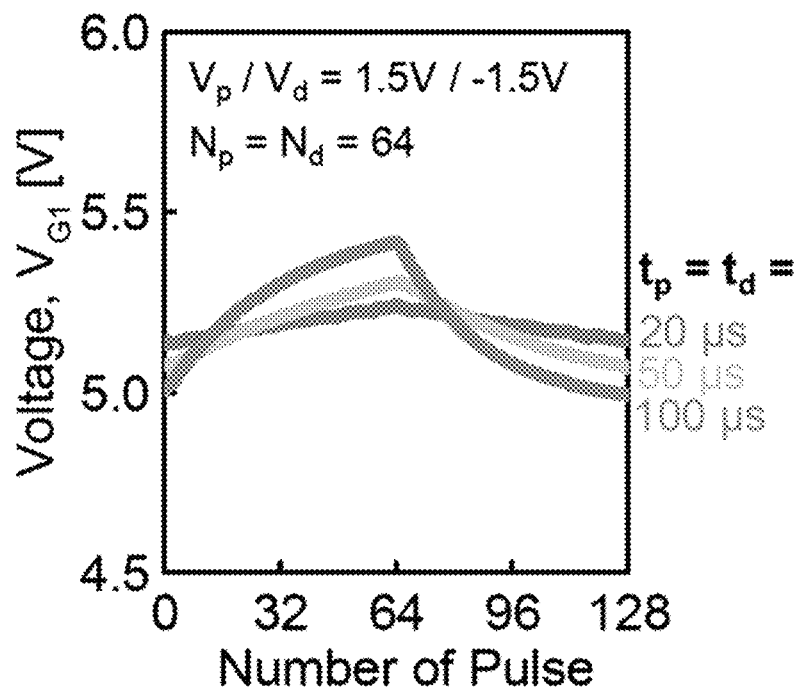
Figure 14F:
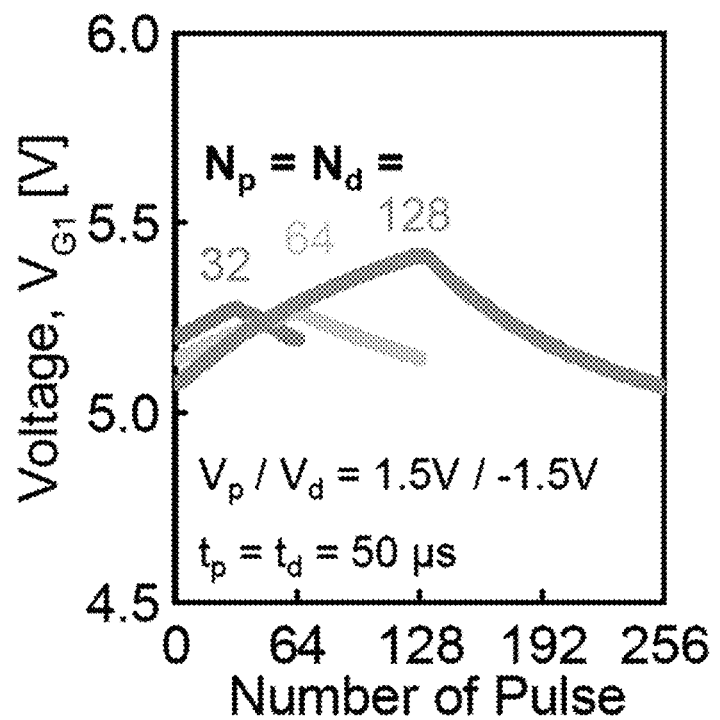
Figure 14G:
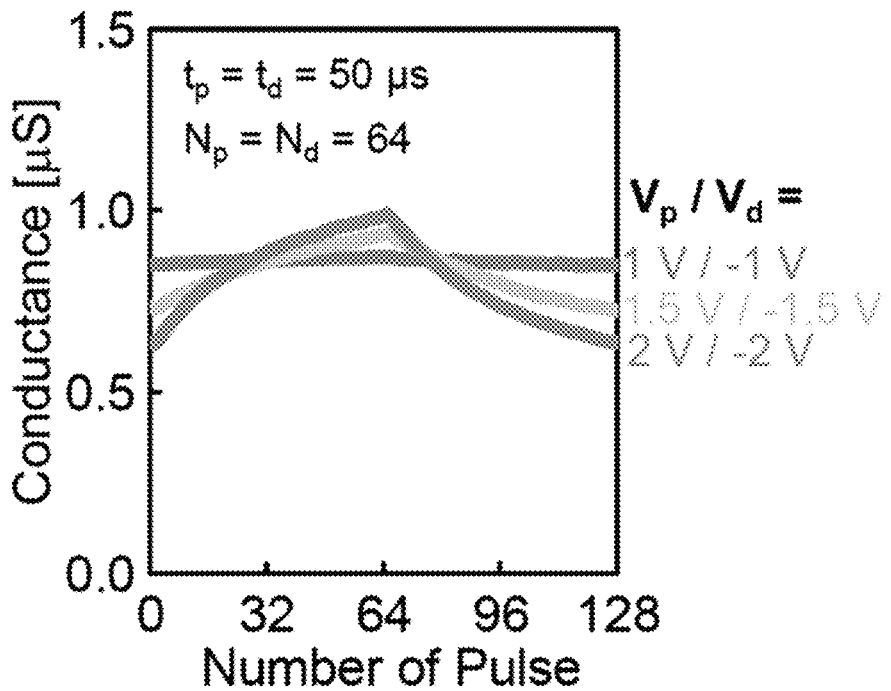
Figure 14H:
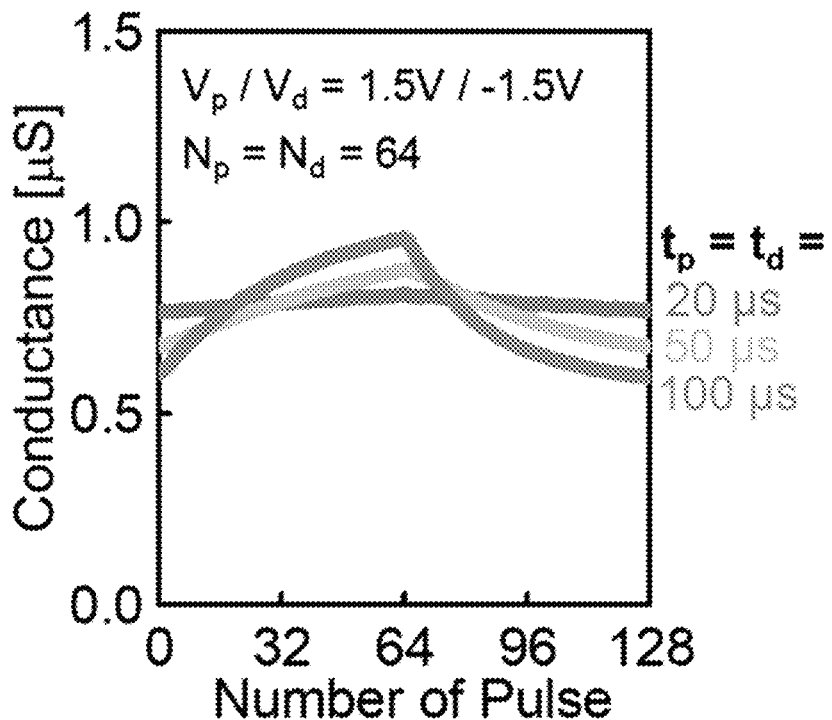
Figure 14I:
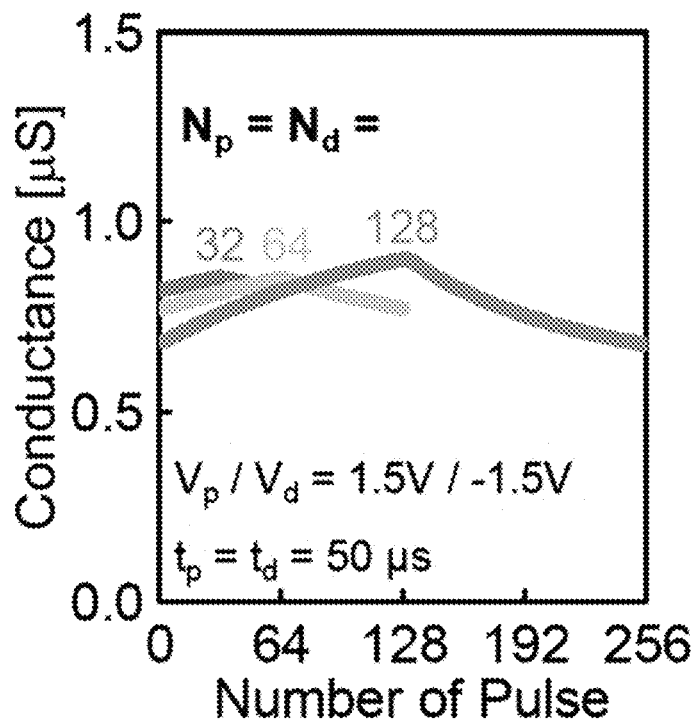

In addition, FIGS. 14D and 14G show changes in the output voltage $V_{G1}$ of the first memristor M1 and changes in the conductance thereof according to the potentiation and depression processes in which each pulse having three types of pulse amplitudes (2V/−2V, 1.5V/−1.5V and 1V/−1V) is input as a memory signal to the first memristor M1 of 2M1T, FIGS. 14E and 14H show changes in the output voltage $V_{G1}$ of the first memristor M1 and changes in the conductance thereof according to the potentiation and depression processes in which each pulse having three types of pulse widths (100 μs, 50 μs and 20 μs) is input as a memory signal to the first memristor M1 of 2M1T, and FIGS. 14F and 14I show changes in the output voltage $V_{G1}$ of the first memristor M1 and changes in the conductance thereof according to the potentiation and depression processes in which each pulse having three types of the maximum number of pulses (128, 64 and 32) is input as a memory signal to the first memristor M1 of 2M1T.

Meanwhile, for application to the synaptic device 50, the memristor 2M requires the linearity and symmetry of conductance modulation with the gradual SET and RESET switching operations (i.e., gradualness). In order to confirm these switching operations, by using the same continuous pulse method having a positive amplitude ($V_p$) for potentiation and a negative amplitude ($V_d$) for depression, conductance modulation characteristics were evaluated for one memristor 1M of FIG. 4 and the synaptic devices 50 of 2M1T fabricated in the structures of FIGS. 5 and 6.

Referring to FIGS. 14A to 14C, the conductance change of 1M is not linearly proportional to the number of applied pulses. Following the first few SET or RESET pulses, a large conductance change occurs, but gradually the conductance change saturates. During the RESET operation, no more gradual conductance modulation was observed after the abrupt change with only one pulse. This non-linearity in the SET and RESET operations is similar to the performance shown in the conventional memristor-based synaptic devices.

As described above, the switching mechanism of the fabricated Pd/IGZO/P$^+$—Si memristors 2M and 1M is determined by oxygen ion migration. That is, in the first SET pulse, oxygen ions are rapidly propelled from BE towards IGZO and TE by the applied electric field. In this case, oxygen vacancies generated in the silicon oxide layer (insulation layer) and IGZO act as conductive paths, increasing the conductance of the memristors 2M and 1M. When oxygen ions accumulate in the TE region of IGZO, an internal electric field with the opposite direction to the applied electric field is created, inhibiting further oxygen migration to the TE interface. Therefore, when the same pulse is applied thereafter, the conductance change gradually decreases. Meanwhile, during the first RESET pulse operation, the direction of the electric field generated by the applied negative voltage coincides with the direction of the internal electric field due to the space-charge effect of oxygen ion distribution. Therefore, the first RESET pulse causes more oxygen ions to migrate than the SET pulse, resulting in an abrupt RESET modulation.

The voltage and conductance modulation characteristics of the 2M1T synaptic device 50 are illustrated in FIGS. 14D to 14I. In order to modulate the conductance of 2M1T, the same potentiation or depression voltage pulses ($V_p$ or $V_d$) were applied to TE1 while a global DC bias of 5.0V was applied to TE1 and TE2. All conductance values were extracted using a synaptic input signal with a drain voltage ($V_D$) of 0.5V.

Compared to 1M, 2M1T showed improved linearity and conductance modulation symmetry. In particular, the initial abrupt conductance change in the RESET process was effectively minimized. This improvement can be explained by Formula (3) above. As described above, the SET and RESET operations are used for potentiating or depressing 2M devices (potentiation: M1 SET operation and M2 RESET operation, and depression: M1 RESET operation and M2 SET operation). The total conductance G of 2M1T is determined by the conductance ratio $G_2/G_1$ of the two memristors M1 and M2. During the depression operation, when a depression pulse is applied, the RESET operation and SET operation occur in M1 and M2, respectively. In this case, even if the conductance $G_1$ of M1 suddenly changes and becomes saturated, the conductance $G_2$ of M2 may be gradually changed due to the continuous SET operation of M2. Accordingly, the total conductance G may be modulated slowly without being saturated. In addition, the modulation of the corresponding G may achieve linearity and symmetry.

Figure 15A:
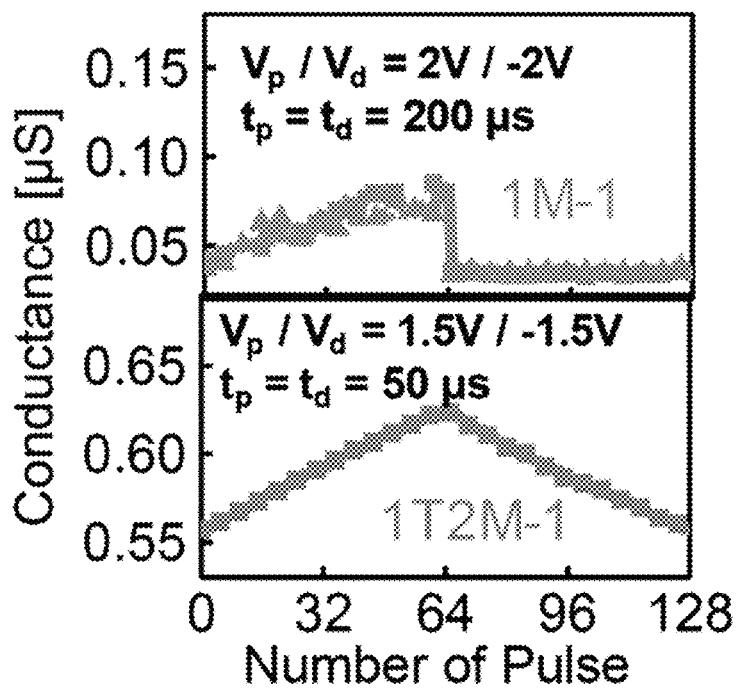
FIGS. 15A-15B shows comparison graphs of the input results of pulses for 1M having an actually fabricated synaptic device 50 and one memristor according to an exemplary embodiment of the present invention.
Figure 15B:
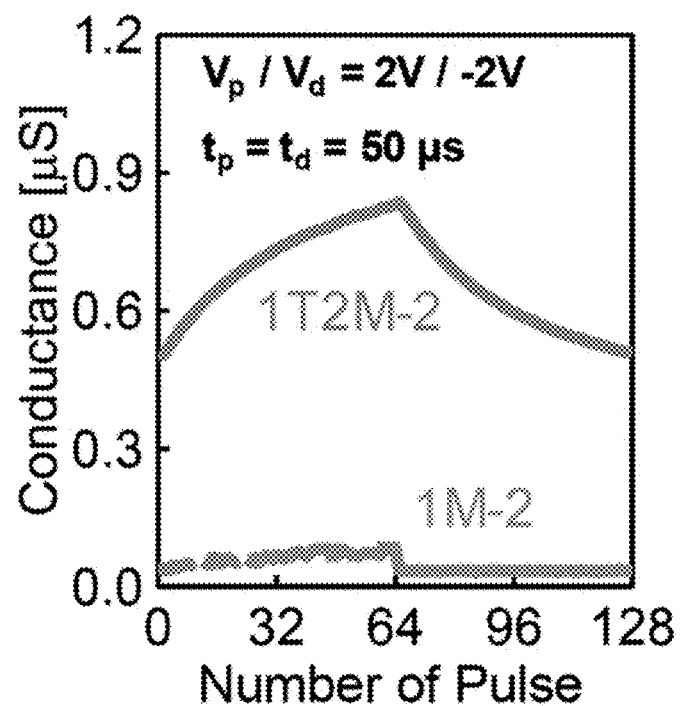

FIGS. 15A-15B show comparison graphs of the input results of pulses for 1M having an actually fabricated synaptic device 50 and one memristor according to an exemplary embodiment of the present invention. That is, FIG. 15A shows a comparison graph of conductance change in the case where two synapses have a similar conductance window ($G_{max}$−$G_{min}$=about 0.06 μS), and FIG. 15B shows a comparison graph of conductance change in the case of two synapses operating under the same pulse condition.

A comparison of the results obtained using 1M and 2M1T is illustrated in FIGS. 15A-15B. Interestingly, 2M1T has a larger total conductance window ($G_{max}$−$G_{min}$) compared to 1M. This increase serves as another important advantage of 2M1T besides improved gradualness, linearity and symmetry. This increase occurs because the intrinsic current amplification of transistor T (i.e., the resistance ratio of two memristors connected to the gate electrode) is further amplified by the transconductance ($g_m$) of the transistor, resulting in the generation of a drain output current (synaptic output current). When the total conductance window increases, a margin between conductance levels increases such that a stable multi-level implementation is possible.

In order to quantitatively analyze the linearity and symmetry of 2M1T, a nonlinear behavioral model was employed. That is, the conductance change according to the number of pulses may be calculated by the Formulae below.

$$G_P = B \times \left[1 - \exp\left(-\frac{N}{A_P}\right)\right] + G_{min} \quad (4)$$

$$G_D = -B \times \left[1 - \exp\left(-\frac{N - N_{max}}{A_D}\right)\right] + G_{max} \quad (5)$$

$$B = \frac{G_{max} - G_{min}}{1 - \exp\left(-\frac{N_{max}}{A_P}\right)} \quad (6)$$

Herein, $G_{max}$ and $G_{min}$ are the maximum conductance and the minimum conductance, respectively, $N_{max}$ represents the maximum number of pulses required to adjust the conductance between $G_{min}$ and $G_{max}$, and B is a fitting parameter. In addition, $A_P$ and $A_D$ are nonlinear parameters of potentiation and depression, respectively. Smaller absolute values of $A_P$ or $A_D$ indicate that the potentiation or depression characteristics are linear. In addition, since the absolute values of $A_P$ and $A_D$ are similar, conductance modulation shows symmetry.

Specific comparisons of the characteristics of 1M and 2M1T are summarized in Table 1.

TABLE 1

|  | 1M-1 [a] | 2M1T-1 [b] | 1M-2 [c] | 2M1T-2 [d] |
|---|---|---|---|---|
| $A_P$ | 32 | 256 | 48 | 32 |
| $A_D$ | 1 | 256 | 1 | 32 |
| $G_{max} - G_{min}$ | 0.047 µS | 0.067 µS | 0.041 µS | 0.329 µS |

However, in

[a] 1M-1 is a case in which a memory signal of $V_p/V_d = 2$ V/−2 V, $t_p = t_d = 200$ µs is input to 1M, and
[b] 2M1T-1 is a case in which a first memory signal of $V_p/V_d = 1.5$ V/−1.5 V, $t_p = t_d = 50$ µs is input to 2M1T. In addition, in
[c] 1M-2 is a case in which a memory signal of $V_p/V_d = 2$ V/−2 V, $t_p = t_d = 50$ µs is input to 1M, and in
[d] 2M1T-2 is a case in which a first memory signal of $V_p/V_d = 2$ V/−2 V, $t_p = t_d = 50$ µs is input to 2M1T.

Figure 16:
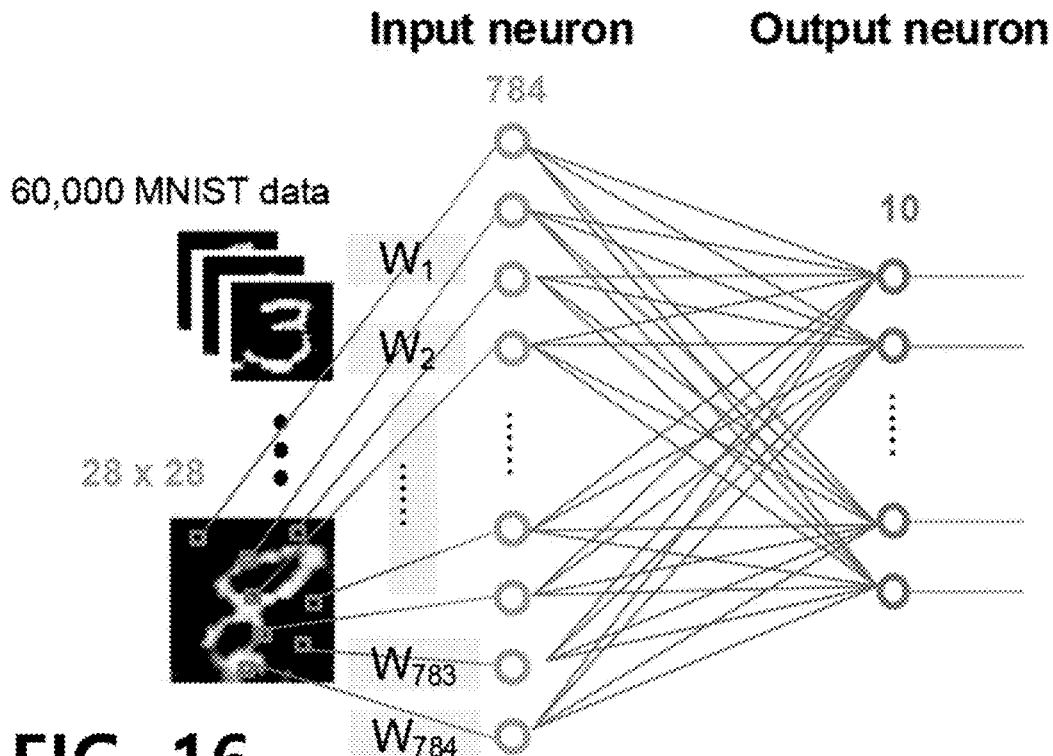
FIG. 16 shows an example of a single-layer neural network used for pattern recognition simulation.
Figure 17:
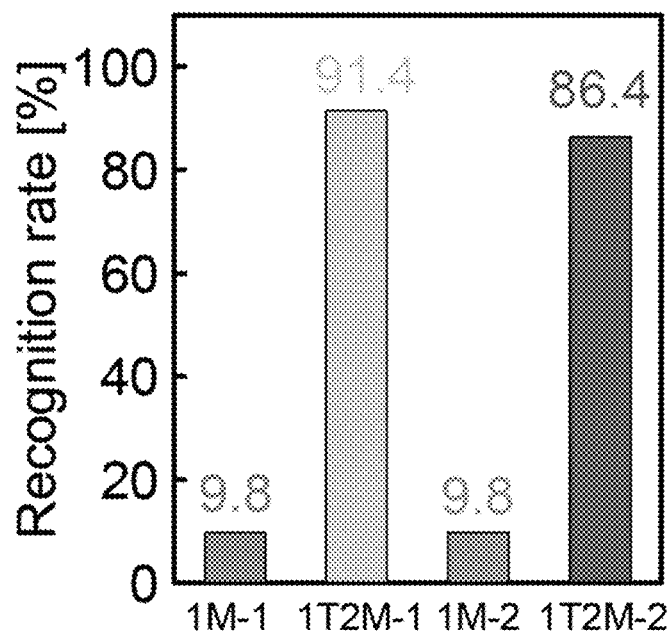
FIG. 17 shows a simulation result using the single-layer neural network of FIG. 16.

FIG. 16 shows an example of a single-layer neural network used for pattern recognition simulation, and FIG. 17 shows a simulation result using the single-layer neural network of FIG. 16.

In order to investigate the effects of nonlinearity and asymmetry of conductance modulation, an on-chip learning simulation of pattern recognition was performed using the MNIST handwritten data set. It is worth noting that nonlinearity and asymmetry do not affect the off-chip learning application because the conductance of the synaptic device 50 may be adjusted to a target level through an iterative program verification scheme. Conversely, in the case of on-chip learning, a programming (potentiation or depression) pulse is applied to each synaptic device 50 without a verification step. In this case, the number of applied pulses is determined by the output current of the corresponding neuron circuit at the end of each column of the synaptic array.

Referring to FIG. 16, a 784×10 single-layer neural network was used instead of a multilayer neural network as a universal method for implementing the on-chip backpropagation algorithm in a hardware system. This single layer may be implemented using a synaptic array designed as shown in FIG. 2. In order to represent a positive synaptic weight value and a negative synaptic weight value, two synaptic devices 50 were grouped into one synaptic unit, as illustrated in FIG. 2. For the four test samples shown in Table 1, the recognition accuracy as a function of the training sample was investigated, and FIG. 17 shows the recognition accuracy results of the corresponding four test samples. Referring to FIG. 17, 1M had a low accuracy of about 10% due to a sudden RESET characteristic, whereas 2M1T had a high accuracy of about 90%, which greatly improved the accuracy.

Figure 18:
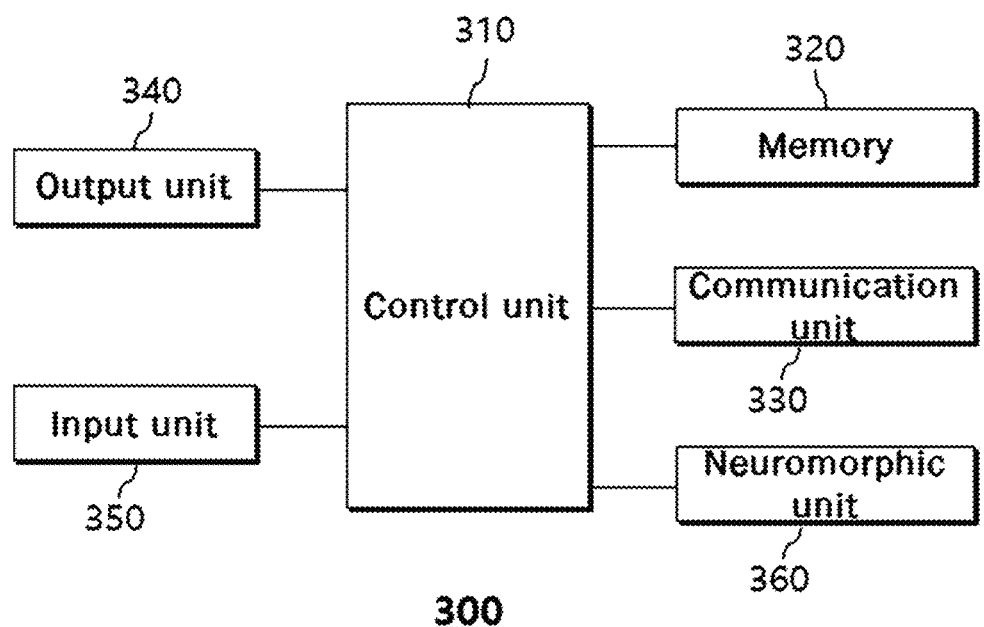
FIG. 18 is a block diagram conceptually illustrating a neuromorphic system 300 according to an exemplary embodiment of the present invention.

Meanwhile, FIG. 18 is a block diagram conceptually illustrating a neuromorphic system 300 according to an exemplary embodiment of the present invention. For example, the neuromorphic system 300 may be a speech recognition system, an imaging recognition system, a code recognition system, a signal recognition system, a pattern recognition system for recognizing various patterns or the like, but is not limited thereto.

Referring to FIG. 18, the neuromorphic system 300 according to an exemplary embodiment of the present invention may include a control unit 310, a memory 320, a communication unit 330, an output unit 340, an input unit 350 and a neuromorphic unit 360. The control unit 310 may generate and transmit various signals for learning using the neuromorphic unit 360, and perform various processing and functions for recognizing patterns such as voices, images and the like, according to the output from the neuromorphic unit 360. In addition, the control unit 310 may be connected to the memory 320, the communication unit 330, the output unit 340 and the neuromorphic unit 360 to control their operations. For example, the control unit 310 may include a processor and the like, but is not limited thereto.

The memory 320 may store various information required to be stored in the neuromorphic system 300. For example, the memory 320 may include a volatile memory device such as DRAM or SRAM, a non-volatile memory such as PRAM, MRAM, ReRAM or NAND flash memory, or a hard disk drive (HDD), a solid-state drive (SSD) or the like, but is not limited thereto.

The communication unit 330 may transmit or receive recognized data, such as voices, images and the like, to a communication unit of another system through a network. For example, the communication unit 330 may perform wireless communication such as 5th generation communication (5G), long term evolution-advanced (LTE-A), long term evolution (LTE), bluetooth, bluetooth low energy (BLE), near field communication (NFC), Wi-Fi communication and the like, or wired communication such as cable communication and the like, but is not limited thereto.

The output unit 340 may output recognized data, such as voices, images and the like in various ways. For example, the output unit 340 may include a speaker, a printer, a monitor, a display panel, a beam projector, a hologrammer, or other various output devices, but is not limited thereto. In addition, when the output unit 340 includes a display panel, the corresponding display panel may be combined with the input unit 350 to be implemented as a touch screen or the like.

The input unit 350 generates input data in response to various user inputs, and may include various input means. For example, the input unit 350 may include at least one of a microphone, a camera, a scanner, a touch pad, a keyboard, a mouse, a mouse pen, or various sensors, but is not limited thereto.

The neuromorphic unit 360 may include the above-described neuromorphic device to perform learning, recognition and the like, and it may output data corresponding to the recognized pattern.

The present invention configured as described above can improve a trade-off characteristic between the symmetry and linearity of conductance modulation in a synaptic device 50, and thus has an advantage in that both the symmetry and linearity can be satisfied. In addition, the present invention has an advantage of improving the gradualness of conductance modulation in a synaptic device 50. In addition, the present invention has an advantage of restricting a sneak path even when a synapse is implemented in a crossbar array structure. In addition, the present invention has an advantage that excellent pattern recognition accuracy is possible when applied to an artificial neural network and the like.

In the detailed description of the present invention, although specific exemplary embodiments have been described, various modifications are possible without departing from the scope of the present invention. Therefore, the scope of the present invention is not limited to the described exemplary embodiments, and should be defined by the following claims and their equivalents.

| Explanation of Reference Numerals: | | | |
|---|---|---|---|
| 10: | Input circuit | 11: | Input line |
| 20: | Output circuit | 21: | Output line |
| 30: | First driver | 31: | First memory line |

-continued

Explanation of Reference Numerals:

| 40: | Second driver | 41: | Second memory line |
|---|---|---|---|
| 50: | Synaptic device | 110, BE: | First electrode |
| 120: | Resistance change layer | 130, TE: | Second electrode |
| 210: | Gate electrode | 220: | Gate insulating layer |
| 230: | Channel material layer | 240: | Source electrode |
| 250: | Drain electrode | | |

The invention claimed is:

1. A synapse, comprising:
a transistor in which a synaptic input signal is applied to any one electrode of source and drain electrodes; and
a plurality of two-terminal variable resistance memory devices in which a first electrode is electrically commonly connected to a gate electrode of the transistor,
wherein a separate memory voltage is applied to a second electrode of each variable resistance memory device to adjust a gate voltage applied to the gate electrode, thereby controlling a synaptic output signal which is output to the other one of the source and drain electrodes.

2. The synapse of claim 1, wherein the total conductance of all variable resistance memory devices is modulated to adjust the gate voltage, by modulating the conductance of each variable resistance memory device according to each memory voltage.

3. The synapse of claim 1, wherein a memory voltage of a bias is applied to a first variable resistance memory device, and
wherein a memory voltage of a potentiation pulse or depression pulse is applied to a second variable resistance memory device.

4. The synapse of claim 1, wherein while the conductance of a first variable resistance memory device increases, the conductance of a second variable resistance memory device decreases, and the modulation of the total conductance of all variable resistance memory devices is limited thereby.

5. The synapse of claim 1, wherein while a first variable resistance memory device performs a SET operation, a second variable resistance memory device performs a RESET operation.

6. The synapse of claim 5, wherein the variable resistance memory device performing a SET operation is in a low resistance state, and the variable resistance memory device performing a RESET operation is in a high resistance state.

7. The synapse of claim 1, wherein when a memory voltage of a bias is applied to a first variable resistance memory device and pulses having a potentiation pulse and a depression pulse are repeatedly applied to a second variable resistance memory device, the total conductance gradually increases and then gradually decreases.

8. The synapse of claim 1, wherein the variable resistance memory device comprises any one of a memristor, a resistive random access memory (RRAM), a phase-change random access memory (PcRAM), a magnetic random access memory (MRAM), a ferroelectric random access memory (FeRAM) and a conductive bridging random access memory (CBRAM).

9. The synapse of claim 1, wherein the variable resistance memory device made of a memristor comprises:
a first electrode electrically connected to the gate electrode;
a resistance change layer provided on the first electrode in which a change in resistance occurs according to an applied voltage between the two electrodes; and
a second electrode provided on the resistance change layer to which a memory voltage is applied.

10. The synapse of claim 9, wherein the resistance change layer is made of an oxide material, and
wherein the resistance is changed in the memristor according to the movement of oxygen charge in accordance with a memory voltage such that the switching characteristic of a SET operation or RESET operation is changed.

11. The synapse of claim 10, wherein while oxygen charge moves from the periphery of the first electrode to the periphery of the second electrode in a first memristor to perform a SET operation, oxygen charge moves from the periphery of the second electrode to the periphery of the first electrode in a second memristor to perform a RESET operation.

12. The synapse of claim 8, wherein the channel layer of the transistor and the resistance change layer of the memristor are made of the same oxide material.

13. The synapse of claim 8, wherein the resistance change layer comprises one or more materials selected from IGZO, ITZO, IWZO, ZSO, IZO and IGO.

14. The synapse of claim 8, wherein the first electrode is made of p-type conductive Si, the first material layer is made of $SiO_2$, and the resistance change layer comprises one or more materials selected from IGZO, ITZO, IWZO, ZSO, IZO and IGO.

15. The synapse of claim 1, wherein the first electrode of each variable resistance memory device and the gate electrode of the transistor have a global electrode structure sharing an electrode with each other.

16. A synaptic array, comprising a plurality of input lines to which a synaptic input signal is input, a plurality of output lines from which a synaptic output signal is output, a plurality of memory lines to which a memory voltage is applied, and a plurality of synapses electrically connected to each line,
wherein the synapse comprises:
a transistor in which any one of source and drain electrodes is electrically connected to the input line, and the other one is electrically connected to the output line; and
a plurality of two-terminal variable resistance memory devices in which each first electrode is electrically globally connected to a gate electrode of the transistor, and each second electrode is electrically connected to a separate memory line to adjust a gate voltage applied to the gate electrode, thereby controlling a synaptic output signal which is output to the other one of the source and drain electrodes.

17. A computing system, comprising a synapse,
wherein the synapse comprises:
a transistor in which a synaptic input signal is applied to any one electrode of source and drain electrodes; and
a plurality of two-terminal variable resistance memory devices in which a first electrode is electrically globally connected to a gate electrode of the transistor,
wherein the synapse applies a separate memory voltage to a second electrode of each variable resistance memory device to adjust a gate voltage applied to the gate electrode, thereby controlling a synaptic output signal which is output to the other one of the source and drain electrodes.

18. The computing system of claim 17, wherein the synapse is implemented in a crossbar array.

19. A method for operating a synapse, the synapse comprising a transistor in which a synaptic input signal is applied to any one electrode of source and drain electrodes, and a plurality of two-terminal variable resistance memory devices in which a first electrode is electrically globally connected to a gate electrode of the transistor, the method comprising:

applying a separate memory voltage to a second electrode of each variable resistance memory device, applying a memory voltage of a bias to a first variable resistance memory device, and applying a memory voltage of a potentiation pulse or a depression pulse to a second variable resistance memory device; and adjusting a gate voltage applied to the gate electrode according to the memory voltage, thereby controlling a synaptic output signal which is output to the other one of the source and drain electrodes.

\* \* \* \* \*